United States Patent [19]

Yano et al.

[11] Patent Number: 5,753,934

[45] Date of Patent: May 19, 1998

[54] MULTILAYER THIN FILM, SUBSTRATE FOR ELECTRONIC DEVICE, ELECTRONIC DEVICE, AND PREPARATION OF MULTILAYER OXIDE THIN FILM

[75] Inventors: Yoshihiko Yano, Kanagawa; Takao Noguchi, Chiba, both of Japan

[73] Assignee: TDK Corporation, Tokyo, Japan

[21] Appl. No.: 524,904

[22] Filed: Sep. 7, 1995

[30] Foreign Application Priority Data

Aug. 4, 1995 [JP] Japan .................................. 7-219850

[51] Int. Cl.[6] .......................... H01L 29/06; H01L 23/58
[52] U.S. Cl. ..................... 257/30; 257/31; 257/635; 257/636; 257/637
[58] Field of Search ................. 257/30, 31, 505, 257/324, 325, 635–637, 701, 702, 707

[56] References Cited

U.S. PATENT DOCUMENTS 5,185,829  2/1993  Yamada et al. .......................... 385/37

Primary Examiner—Wael Fahmy
Assistant Examiner—Fetsum Abraham
Attorney, Agent, or Firm—Oblon, Spivak, McClelland, Maier & Neustadt, P.C.

[57] ABSTRACT

A multilayer thin film of the invention has an oxide thin film formed on a semiconductor single crystal substrate, and the oxide thin film includes at least one epitaxial thin film composed mainly of zirconium oxide or zirconium oxide stabilized with a rare earth metal element (inclusive of scandium and yttrium). Included is an oriented thin film formed on the oxide thin film from a dielectric material of perovskite or tungsten bronze type with its c-plane unidirectionally oriented parallel to the substrate surface. Consequently, there are provided a perovskite oxide thin film of (001) orientation, a substrate for an electronic device comprising the thin film, and a method for preparing the thin film.

141 Claims, 22 Drawing Sheets

← TOP    BOTTOM →

2000000X

MULTILAYER THIN FILM, SUBSTRATE FOR ELECTRONIC DEVICE, ELECTRONIC DEVICE, AND PREPARATION OF MULTILAYER OXIDE THIN FILM

BACKGROUND OF THE INVENTION

1. Field of the Invention

This invention relates to a multilayer thin film, a substrate for electronic devices, an electronic device, and a method for preparing the multilayer oxide thin film, and more particularly, to a multilayer thin film comprising a dielectric layer of perovskite or tungsten bronze type, a substrate for electronic devices comprising the multilayer thin film, an electronic device, and a method for preparing the multilayer thin film. Especially, it relates to a multilayer film structure for main use in semiconductor memory cells and transistor cells.

2. Background Art

Electronic devices have been elaborated which are fabricated by forming superconducting films or dielectric films on semiconductor crystal substrates which are typically silicon single crystal substrates, followed by integration. By combining semiconductors with superconductors or dielectrics, attempts have been made to fabricate a variety of devices, for example, SQUID, Josephson devices, superconducting transistors, electromagnetic sensors, and superconductor wired LSIs for the combination of semiconductors with superconductors, and LSIs having a higher degree of integration, dielectric isolated LSIs relying on SOI technology, non-volatile memories, infrared sensors, optical modulators, optical switches, and OEIC (opto-electronic integrated circuits) for the combination of semiconductors with dielectrics.

In order that these semiconductor devices using superconducting materials or dielectric materials afford optimum device characteristics and reproducibility thereof, single crystals must be used as the superconducting materials or dielectric materials. Polycrystalline materials are difficult to achieve good device characteristics due to the disturbance of physical quantities by grain boundaries. This is also true for thin film materials, and a superconducting or dielectric epitaxial film which is as close to a complete single crystal as possible is desirable.

As to crystal structure, most oxide superconductors and ferroelectric materials which are valuable in applications have a perovskite structure. Since epitaxial growth of perovskite type oxides largely depends on the material and crystal orientation of the underlying substrate, direct epitaxial growth of perovskite type oxides on silicon substrates is impossible at present. It was then proposed to form buffer layers of YSZ ($ZrO_2$ doped with yttrium) epitaxially grown on silicon and allow superconducting films of YBCO and Bi systems which are perovskite type oxides to epitaxially grow thereon as disclosed in Appl. Phys. Lett., Vol. 54, No. 8, pp. 754–756 (1989), Japanese Journal of Applied Physics, Vol. 27, No. 4, L634–635 (1988), and Japanese Patent Application Kokai (JP-A) No. 82585/1990.

In particular, since thin films composed mainly of $ZrO_2$ have good lattice matching with substrate silicon crystals and are also improved in lattice matching with perovskite crystals, epitaxial films composed mainly of $ZrO_2$ on silicon substrates have drawn attention from the early years as a buffer between silicon substrates and perovskite crystal films.

However, the perovskite type oxide crystals which have succeeded in direct epitaxial growth using buffer layers composed mainly of $ZrO_2$ are $YBa_2Cu_3O_{7-x}$ (YBCO), $BiSrCaCu_2O_x$, $LaSrCoO_3$, etc., all of which are composite perovskite materials. The composite perovskite materials have crystal structures of $K_2NiF_4$, $Nd_2CuO_4$, $Sr_3Ti_2O_7$ and other types which are modifications of simple perovskite. These composite perovskite materials have a long periodicity structure in a c-axis direction and are strongly anisotropic with respect to a and c axes. Consequently, they are strongly c-axis orienting and are likely to form epitaxial films of c-axis orientation on the substrate which is made c-plane. As described in Appl. Phys. Lett., 57 (11), 1161–1163 (1990), the plane orientation relationship of epitaxial films is YBCO (001)//YSZ (001)//Si (001) and YBCO [110]//YSZ [100]//Si [100]. With a unit lattice of YBCO rotated 45° in c-plane with respect to the lattice of YSZ, a lattice matching is achieved allowing for epitaxial growth.

However, our study reveals that in the case of $BaTiO_3$ which is typical of the materials based on a simple perovskite structure such as $BaTiO_3$, $SrTiO_3$, $PbTiO_3$, PZT and PLZT, as mentioned above, it was impossible for $BaTiO_3$ to epitaxially grow by rotating its unit lattice 45° in c-plane with respect to the lattice of YSZ so as to set up $BaTiO_3$ (001)//YSZ (001)//Si (001) and $BaTiO_3$ [110]//YSZ [100]//Si [100] to achieve a lattice matching. No reports have been made by other researchers.

This is probably because the materials based on a simple perovskite structure such as $BaTiO_3$, $SrTiO_3$, $PbTiO_3$, PZT and PLZT have a perovskite structure of a simple unit lattice and less anisotropy and consequently, a lattice matching is achieved by changing (001) oriented growth of the simple perovskite structure to (110) orientation rather than in-plane rotation. Therefore, no (001) oriented epitaxial films of the simple perovskite structure are obtainable.

It is noted that $BaTiO_3$, $PbTiO_3$, PZT and PLZT are ferroelectric and can form non-volatile memories by combining with semiconductor devices. These memories utilize the polarization reversal phenomenon of ferroelectric materials while ferroelectric materials such as $BaTiO_3$, $PbTiO_3$, PZT and PLZT have a polarization axis aligned with c-axis direction of the perovskite structure. Therefore, in order to utilize these ferroelectric films as memories, (001) oriented films must be used. However, as mentioned above, (001) oriented epitaxial films of materials of simple perovskite structure such as $BaTiO_3$, $PbTiO_3$, PZT and PLZT have never been obtained using buffer layers composed mainly of $ZrO_2$ on silicon.

DISCLOSURE OF THE INVENTION

A primary object of the present invention is to provide a simple perovskite oxide thin film of (001) orientation, an electronic device substrate comprising the thin film, and a method for preparing the same.

Making investigations to solve the problems, we have discovered that the problems can be solved by using a thin film having high crystallinity and flatness on the molecular level as a thin film composed mainly of $ZrO_2$ and by finding a novel crystal growth method, especially for perovskite oxide thin films.

This and other objects are achieved by the present invention which is defined below as (1) to (75).

(1) A multilayer thin film comprising an oxide thin film formed on a semiconductor single crystal substrate, said oxide thin film comprising at least one epitaxial thin film composed mainly of zirconium oxide or zirconium oxide stabilized with a rare earth metal element (inclusive of scandium and yttrium), and an oriented thin film formed on said oxide thin film from a dielectric material of perovskite or tungsten bronze type with its c-plane unidirectionally oriented parallel to the substrate surface.

(2) The multilayer thin film of (1) wherein said dielectric material of perovskite or tungsten bronze type is selected from the group consisting of barium titanate, strontium titanate, lead zirconate titanate (PZT), strontium barium niobate (SBN) and lead barium niobate (PBN).

(3) The multilayer thin film of (1) wherein said oriented thin film is an epitaxial film.

(4) The multilayer thin film of (3) wherein said semiconductor single crystal substrate is a silicon single crystal substrate having a Si (100) plane at its surface and the crystal axis orientation relationship between said oriented thin film and the silicon single crystal substrate is perovskite or tungsten bronze [100]//Si [100].

(5) The multilayer thin film of (1) wherein the zirconium oxide or zirconium oxide stabilized with a rare earth metal element (inclusive of scandium and yttrium) of said oxide thin film has the composition: $Zr_{1-x}R_xO_{2-\delta}$ wherein R is a rare earth metal element inclusive of scandium and yttrium, x is a number of 0 to 0.75, and $\delta$ is a number of 0 to 0.5.

(6) The multilayer thin film of (1) wherein the zirconium oxide of said oxide thin film contains at least 93 mol % of Zr based on the amount of only constituent elements excluding oxygen.

(7) The multilayer thin film of (1) wherein a rocking curve of (002) reflection of said oxide thin film has a half-value width of up to 1.5°.

(8) The multilayer thin film of (1) wherein said oxide thin film has a ten point mean roughness Rz of up to 2 nm across a reference length of 500 nm over at least 80% of its surface.

(9) The multilayer thin film of (1) wherein said oxide thin film is an oxide thin film comprising a first epitaxial film composed mainly of zirconium oxide or zirconium oxide stabilized with a rare earth metal element (inclusive of scandium and yttrium) and a second epitaxial film formed thereon of a perovskite type material.

(10) The multilayer thin film of (9) wherein the perovskite type material of said second epitaxial film is composed mainly of barium titanate or titanium type strontium.

(11) The multilayer thin film of (9) wherein the crystal axis orientation relationship between said silicon single crystal substrate and said second epitaxial film of perovskite type material is perovskite [100]//Si [100].

(12) A multilayer thin film comprising an oriented thin film which is formed on a silicon single crystal substrate of silicon single crystal having a Si (100) plane at its surface from a perovskite or tungsten bronze type material, is an epitaxial film, and has a crystal axis orientation relationship of perovskite or tungsten bronze [100]//Si [100].

(13) The multilayer thin film of (12) wherein said perovskite or tungsten bronze type material is selected from the group consisting of barium titanate, strontium titanate, lead zirconate titanate (PZT), strontium barium niobate (SBN) and lead barium niobate (PBN).

(14) The multilayer thin film of (12) further comprising an oxide thin film interposed between said silicon single crystal substrate and said oriented thin film, said oxide thin film comprising at least one epitaxial thin film composed mainly of zirconium oxide or zirconium oxide stabilized with a rare earth metal element (inclusive of scandium and yttrium).

(15) The multilayer thin film of (14) wherein the zirconium oxide or zirconium oxide stabilized with a rare earth metal element (inclusive of scandium and yttrium) of said oxide thin film has the composition: $Zr_{1-x}R_xO_{2-\delta}$ wherein R is a rare earth metal element inclusive of scandium and yttrium, x is a number of 0 to 0.75, and $\delta$ is a number of 0 to 0.5.

(16) The multilayer thin film of (14) wherein the zirconium oxide of said oxide thin film contains at least 93 mol % of Zr based on the amount of only constituent elements excluding oxygen.

(17) The multilayer thin film of (14) wherein a rocking curve of (002) reflection of said oxide thin film has a half-value width of up to 1.5°.

(18) The multilayer thin film of (14) wherein said oxide thin film has a ten point mean roughness Rz of up to 2 nm across a reference length of 500 nm over at least 80% of its surface.

(19) The multilayer thin film of (14) wherein said oxide thin film is an oxide thin film comprising at least a first epitaxial film composed mainly of zirconium oxide or zirconium oxide stabilized with a rare earth metal element (inclusive of scandium and yttrium) and a second epitaxial film formed thereon of a perovskite type material.

(20) The multilayer thin film of (19) wherein the perovskite type material of said second epitaxial film is composed mainly of barium titanate or titanium type strontium.

(21) The multilayer thin film of (19) wherein the crystal axis orientation relationship between said silicon single crystal substrate and said second epitaxial film of perovskite type material is perovskite [100]//Si [100].

(22) A multilayer thin film comprising on a semiconductor single crystal substrate an oriented thin film which is an epitaxial film formed of a tungsten bronze type material.

(23) The multilayer thin film of (22) wherein said tungsten bronze type material is strontium barium niobate (SBN) or lead barium niobate (PBN).

(24) The multilayer thin film of (22) further comprising an oxide thin film interposed between said semiconductor single crystal substrate and said oriented thin film, said oxide thin film comprising at least one epitaxial thin film composed mainly of zirconium oxide or zirconium oxide stabilized with a rare earth metal element (inclusive of scandium and yttrium).

(25) The multilayer thin film of (22) wherein said semiconductor single crystal substrate is a silicon single crystal substrate having a Si (100) plane at its surface.

(26) The multilayer thin film of (24) wherein the zirconium oxide or zirconium oxide stabilized with a rare earth metal element (inclusive of scandium and yttrium) of said oxide thin film has the composition: $Zr_{1-x}R_xO_{2-\delta}$ wherein R is a rare earth metal element inclusive of scandium and yttrium, x is a number of 0 to 0.75, and $\delta$ is a number of 0 to 0.5.

(27) The multilayer thin film of (24) wherein the zirconium oxide of said oxide thin film contains at least 93 mol % of Zr based on the amount of only constituent elements excluding oxygen.

(28) The multilayer thin film of (24) wherein a rocking curve of (002) reflection of said oxide thin film has a half-value width of up to 1.5°.

(29) The multilayer thin film of (24) wherein said oxide thin film has a ten point mean roughness Rz of up to 2 nm across a reference length of 500 nm over at least 80% of its surface.

(30) The multilayer thin film of (24) wherein said oxide thin film is an oxide thin film comprising at least a first epitaxial film composed mainly of zirconium oxide or zirconium oxide stabilized with a rare earth metal element (inclusive of scandium and yttrium) and a second epitaxial film formed thereon of a perovskite type material.

(31) The multilayer thin film of (30) wherein the perovskite type material of said second epitaxial film is composed mainly of barium titanate or titanium type strontium.

(32) The multilayer thin film of (30) wherein the crystal axis orientation relationship between said silicon single crystal substrate and said second epitaxial film of perovskite type material is perovskite [100]//Si [100].

(33) A multilayer thin film comprising a first epitaxial thin film formed on a semiconductor single crystal substrate and composed mainly of zirconium oxide or zirconium oxide stabilized with a rare earth metal element (inclusive of scandium and yttrium) and an oriented thin film which is a second epitaxial film formed directly on the first epitaxial thin film from a dielectric material of perovskite or tungsten bronze type.

(34) The multilayer thin film of (33) wherein said dielectric material of perovskite or tungsten bronze type is barium titanate or strontium titanate of perovskite type.

(35) The multilayer thin film of (33) wherein said semiconductor single crystal substrate is a silicon single crystal substrate having a Si (100) plane at its surface and the crystal axis orientation relationship between said oriented thin film and the silicon single crystal substrate is perovskite or tungsten bronze [100]//Si [100].

(36) The multilayer thin film of (33) wherein the zirconium oxide or zirconium oxide stabilized with a rare earth metal element (inclusive of scandium and yttrium) has the composition: $Zr_{1-x}R_xO_{2-\delta}$ wherein R is a rare earth metal element inclusive of scandium and yttrium, x is a number of 0 to 0.75, and $\delta$ is a number of 0 to 0.5.

(37) The multilayer thin film of (33) wherein the zirconium oxide contains at least 93 mol % of Zr based on the amount of only constituent elements excluding oxygen.

(38) The multilayer thin film of (33) wherein a rocking curve of (002) reflection of said first epitaxial film has a half-value width of up to 1.5°.

(39) The multilayer thin film of (33) wherein said first epitaxial film has a ten point mean roughness Rz of up to 2 nm across a reference length of 500 nm over at least 80% of its surface.

(40) A multilayer thin film comprising on a silicon single crystal substrate having a Si (100) plane at its surface a conductive oriented thin film which is an epitaxial film formed of a metal or conductive oxide with its c-plane or a-plane unidirectionally oriented parallel to the substrate surface.

(41) The multilayer thin film of (40) wherein said metal is a metal containing at least one member selected from the group consisting of Pt, Ir, Os, Re, Pd, Rh, and Ru, and said conductive oxide is an indium-containing oxide or perovskite oxide.

(42) The multilayer thin film of (40) further comprising an oxide thin film interposed between said silicon single crystal substrate and said metal oriented thin film, said oxide thin film comprising at least one epitaxial thin film composed mainly of zirconium oxide or zirconium oxide stabilized with a rare earth metal element (inclusive of scandium and yttrium).

(43) The multilayer thin film of (42) wherein the zirconium oxide or zirconium oxide stabilized with a rare earth metal element (inclusive of scandium and yttrium) of said oxide thin film has the composition: $Zr_{1-x}R_xO_{2-\delta}$ wherein R is a rare earth metal element inclusive of scandium and yttrium, x is a number of 0 to 0.75, and $\delta$ is a number of 0 to 0.5.

(44) The multilayer thin film of (42) wherein the zirconium oxide of said oxide thin film contains at least 93 mol % of Zr based on the amount of only constituent elements excluding oxygen.

(45) The multilayer thin film of (42) wherein a rocking curve of (002) reflection of said oxide thin film has a half-value width of up to 1.5°.

(46) The multilayer thin film of (42) wherein said oxide thin film has a ten point mean roughness Rz of up to 2 nm across a reference length of 500 nm over at least 80% of its surface.

(47) The multilayer thin film of (42) wherein said oxide thin film is an oxide thin film comprising at least a first epitaxial film composed mainly of zirconium oxide or zirconium oxide stabilized with a rare earth metal element (inclusive of scandium and yttrium) and a second epitaxial film formed thereon of a perovskite type material.

(48) The multilayer thin film of (47) wherein the perovskite type material of said second epitaxial film is composed mainly of barium titanate or titanium type strontium.

(49) The multilayer thin film of (47) wherein the crystal axis orientation relationship between said silicon single crystal substrate and said second epitaxial film of perovskite type material is perovskite [100]//Si [100].

(50) A multilayer thin film comprising on a silicon single crystal substrate of silicon single crystal having a Si (100) plane at its surface a conductive oriented film which is an epitaxial film formed of a metal or conductive oxide with its c-plane or a-plane unidirectionally oriented parallel to the substrate surface, and an oriented thin film formed on said conductive oriented film from a perovskite or tungsten bronze type material.

(51) The multilayer thin film of (50) wherein said metal is a metal containing at least one member selected from the group consisting of Pt, Ir, Os, Re, Pd, Rh, and Ru, and said conductive oxide is an indium-containing oxide or perovskite oxide.

(52) The multilayer thin film of (50) wherein said perovskite or tungsten bronze type material is selected from the group consisting of barium titanate, strontium titanate, lead zirconate titanate (PZT), strontium barium niobate (SBN) and lead barium niobate (PBN).

(53) The multilayer thin film of (50) wherein said oriented thin film is an epitaxial film.

(54) The multilayer thin film of (50) wherein the crystal axis orientation relationship between said silicon substrate and said oriented thin film is perovskite or tungsten bronze [100]//Si [100].

(55) The multilayer thin film of (50) further comprising an oxide thin film interposed between said silicon single crystal substrate and said metal oriented thin film, said oxide thin film comprising at least one epitaxial thin film composed mainly of zirconium oxide or zirconium oxide stabilized with a rare earth metal element (inclusive of scandium and yttrium).

(56) The multilayer thin film of (50) wherein the plane orientation relationship among said silicon single crystal substrate, said metal oriented thin film, and said oriented thin film is perovskite or tungsten bronze (100)//metal (100)//Si (100).

(57) The multilayer thin film of (55) wherein the zirconium oxide or zirconium oxide stabilized with a rare earth metal element (inclusive of scandium and yttrium) of said oxide thin film has the composition: $Zr_{1-x}R_xO_{2-\delta}$ wherein R is a rare earth metal element inclusive of scandium and yttrium, x is a number of 0 to 0.75, and δ is a number of 0 to 0.5.

(58) The multilayer thin film of (55) wherein the zirconium oxide of said oxide thin film contains at least 93 mol % of Zr based on the amount of only constituent elements excluding oxygen.

(59) The multilayer thin film of (55) wherein a rocking curve of (002) reflection of said oxide thin film has a half-value width of up to 1.5°.

(60) The multilayer thin film of (55) wherein said oxide thin film has a ten point mean roughness Rz of up to 2 nm across a reference length of 500 nm over at least 80% of its surface.

(61) The multilayer thin film of (55) wherein said oxide thin film is an oxide thin film comprising at least a first epitaxial film composed mainly of zirconium oxide or zirconium oxide stabilized with a rare earth metal element (inclusive of scandium and yttrium) and a second epitaxial film formed thereon of a perovskite type material.

(62) The multilayer thin film of (61) wherein the perovskite type material of said second epitaxial film is composed mainly of barium titanate or titanium type strontium.

(63) The multilayer thin film of (61) wherein the crystal axis orientation relationship between said silicon single crystal substrate and said second epitaxial film of perovskite type material is perovskite [100]//Si [100].

(64) A substrate for an electronic device comprising the multilayer thin film of any one of (1) to (63).

(65) An electronic device comprising the multilayer thin film of any one of (1) to (63).

(66) A method for preparing a multilayer thin film comprising a semiconductor single crystal substrate, an oxide thin film formed thereon from zirconium oxide or zirconium oxide stabilized with a rare earth metal element (inclusive of scandium and yttrium), and an oriented thin film formed on said oxide thin film from a perovskite or tungsten bronze type material, said method comprising carrying out in a vacuum chamber the steps of heating a silicon single crystal substrate, introducing an oxidizing gas into the vacuum chamber, and supplying zirconium or zirconium and at least one rare earth element (inclusive of scandium and yttrium) to the single crystal substrate surface by evaporation, thereby epitaxially growing the oxide thin film on the single crystal substrate surface to form a unidirectionally oriented epitaxial film which serves as said oxide thin film.

(67) The method for preparing a multilayer thin film of (66) wherein the zirconium oxide or zirconium oxide stabilized with a rare earth metal element (inclusive of scandium and yttrium) has the composition: $Zr_{1-x}R_xO_{2-\delta}$ wherein R is a rare earth metal element inclusive of scandium and yttrium, x is a number of 0 to 0.75, and δ is a number of 0 to 0.5.

(68) The method for preparing a multilayer thin film of (66) wherein said semiconductor single crystal substrate is a surface treated silicon substrate which is formed of a silicon single crystal substrate and has on its surface a 1×1 surface structure formed of zirconium or zirconium and at least one rare earth metal element (inclusive of scandium and yttrium) and oxygen.

(69) The method for preparing a multilayer thin film of (66) wherein said surface treated silicon substrate used is a silicon single crystal substrate which has been treated by forming a silicon oxide layer of 0.2 to 10 nm thick on a substrate surface, setting the substrate at a temperature of 600° to 1,200° C., introducing an oxidizing gas into the vacuum chamber to establish an atmosphere of $1\times10^{-4}$ to $1\times10^{-1}$ Torr at least in the proximity of the substrate, and in these conditions, introducing by evaporation zirconium or zirconium and at least one rare earth metal element (inclusive of scandium and yttrium) to the substrate surface having the silicon oxide layer formed thereon.

(70) The method for preparing a multilayer thin film of (69) wherein the step of forming a silicon oxide layer includes heating a silicon single crystal substrate at 300° to 700° C. in the vacuum chamber having an oxidizing gas introduced therein while establishing an oxygen partial pressure of not lower than $1\times10^{-4}$ Torr at least in the atmosphere proximate to the substrate in the vacuum chamber, thereby forming the silicon oxide layer.

(71) The method for preparing a multilayer thin film of (66) wherein an oxidizing gas is injected toward the surface of said silicon single crystal substrate from the proximity thereof, thereby creating only in the vicinity of said single crystal substrate an atmosphere having a higher oxidizing gas partial pressure than the remainder.

(72) The method for preparing a multilayer thin film of (66) wherein said silicon single crystal substrate has a surface area of at least 10 square centimeter and is rotated within its plane, thereby providing an atmosphere of high partial pressure oxidizing gas entirely over said single crystal substrate for forming a substantially uniform oxide thin film over the entire surface of said single crystal substrate.

(73) The method for preparing a multilayer thin film of (66) wherein said silicon single crystal substrate is heated to at least 750° C. during formation of said epitaxial film.

(74) A method for preparing a multilayer thin film comprising a semiconductor single crystal substrate, an oxide thin film formed thereon from zirconium oxide or zirconium oxide stabilized with a rare earth metal element (inclusive of scandium and yttrium), and an oriented thin film formed on said oxide thin film from a perovskite or tungsten bronze type material, said method comprising carrying out in a vacuum chamber the steps of heating a silicon single crystal substrate having the oxide thin film formed thereon, introducing an oxidizing gas into the vacuum chamber, and supplying by evaporation constituent metals of the perovskite or tungsten bronze type material to the silicon single crystal substrate surface having the oxide oriented film formed thereon, wherein in an initial stage when a film is being formed to a thickness of 0 to 1 nm, an A site metal and a B site metal of the perovskite or tungsten bronze composition are supplied such that the feed ratio A/B in molar ratio may range from 0 to 1 for the perovskite type material and from 0 to 0.5 for the tungsten bronze type material, thereby epitaxially growing the oriented film on the oxide thin film to form a c-plane unidirectionally oriented film which serves as said oriented film.

(75) The method for preparing a multilayer thin film of (74) wherein said silicon single crystal substrate is heated to at least 800° C. during formation of said epitaxial film.

FUNCTION AND BENEFIT

As described above, a simple perovskite film or oriented film can be effectively epitaxially grown on a first oxide thin film (underlying layer) according to the invention. In the case of $BaTiO_3\text{-}Zr_{1-x}R_xO_{1-\delta}\text{-}Si$, for example, a $BaTiO_3$ thin film of (001) orientation can be obtained by growing with the plane orientation relationship set to $BaTiO_3$ (001)//$Zr_{1-x}R_xO_{2-\delta}$ (001)//Si (001) and the crystal axis orientation set to $BaTiO_3$ [100]//$Zr_{1-x}R_xO_{2-\delta}$[100]//Si [100]. Also, by using this multilayer thin film as an underlying oxide thin film, that is, a buffer layer, conductive epitaxial films of dielectric (ferroelectric) materials of perovskite and tungsten bronze types, metals, and conductive oxides can be obtained on silicon.

Also particularly when a substrate is rotated in its plane during evaporation, a multilayer oxide thin film of uniform high quality having a large area of 10 cm² or more can be obtained.

It is to be noted that JP-A 258700/1990 discloses a technique of forming a perovskite type oxide ($BaTiO_3$) single crystal film on a single crystal oxide substrate by codeposition wherein distinct evaporation sources of metal elements are used to control a compositional ratio, the oxygen pressure is increased only in the proximity of the substrate, and the substrate used has a specific orientation plane. The multilayer thin film of the invention further enables formation of an epitaxial film having a plane orientation relationship $BaTiO_3$ (001)//$Zr_{1-x}R_xO_{2-\delta}$ (001)//Si (001) and $BaTiO_3$ [100]//$Zr_{1-x}R_xO_{2-\delta}$ [100]//Si [100] only when the following conditions are optimized. More specifically, growth of a (001) epitaxial film on a silicon substrate is made possible by using an epitaxial film formed on a Si (100) single crystal, of the composition: $Zr_{1-x}R_xO_{2-\delta}$ wherein R is a rare earth metal inclusive of yttrium, $x=0$ to 0.75, and $\delta=0$ to 0.5, and having high crystallinity and flatness on the molecular level as the substrate subject to evaporation, setting the heating temperature of the substrate subject to evaporation at 850° to 1,200° C., and setting a metal element feed ratio Ba/Ti of from 0 to 1 (feeding a B site metal in excess) in an initial stage of $BaTiO_3$ formation, that is, when a film is being formed to a thickness of 0 to 1 nm. Perovskite type materials other than $BaTiO_3$ and tungsten bronze type materials can be similarly prepared, that is, by feeding an excess of B site metal in an initial stage of film formation.

It is also understood that the technique disclosed in JP-A 258700/1990 does not address or suggest a substrate having a surface area as large as 10 cm² or more. In fact, JP-A 258700/1990 contains only one example wherein the substrate has an area of 2.25 cm² (about 15×15 mm²). The present invention enables the use of a substrate having a surface area of 10 cm² or more by rotating the substrate in the substrate plane.

ILLUSTRATIVE CONSTRUCTION

Figure 1:
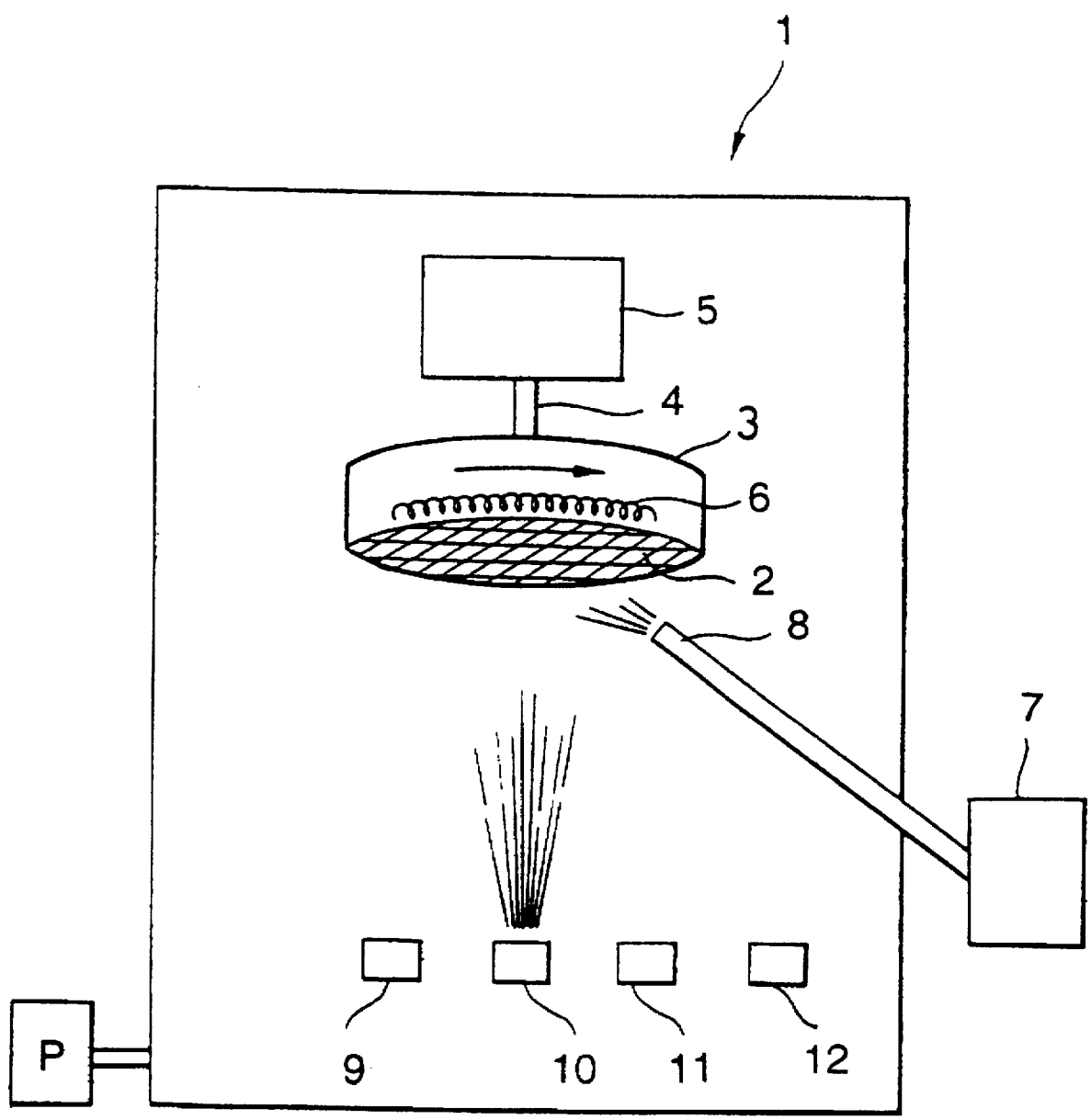
FIG. 1 is a view illustrating one exemplary evaporation apparatus used in a method for preparing a substrate for electronic devices according to the invention.

According to a first aspect of the present invention, a multilayer thin film is characterized by comprising an oxide thin film including at least one epitaxial thin film composed mainly of zirconium oxide or zirconium oxide stabilized with a rare earth metal element (inclusive of scandium and yttrium) and formed on a semiconductor single crystal substrate, and an oriented thin film formed on the oxide thin film serving as an underlying layer from a perovskite or tungsten bronze type material with its c-plane oriented parallel to the substrate surface, that is, (001) oriented, more preferably c-plane unidirectionally oriented and further preferably epitaxially grown.

It is noted that the term "unidirectionally oriented film" designates a crystallized film in which the objective crystal face is aligned parallel to the substrate surface. In the case of a (001) unidirectionally oriented or c plane unidirectionally oriented film, for example, it is a film which has an intensity of reflection other than on (001) plane which is up to 5% of the maximum peak intensity of reflection on (001) plane as analyzed by 2θ-θ X-ray diffraction (XRD). It is noted that the (111) unidirectionally oriented film used herein is a film having an intensity of reflection other than on (111) plane which is up to 5% of the maximum peak intensity of reflection on (111) plane. It is further noted that the term "epitaxial film" used herein means that crystals are oriented in alignment in all the directions of X, Y, and Z axes, provided that the film's substrate surface is a X-Y plane and the film's thickness direction is Z axis, and in X-ray or electron-ray diffraction measured in the respective directions, the intensity of reflection other than the objective reflection is up to 5% of the maximum intensity on the objective plane. In the case of a (001) epitaxial film or c plane epitaxial film, for example, if a film as analyzed by 2θ-θ X-ray diffraction has an intensity of reflection other than on (001) plane which is up to 5% of the maximum peak intensity of reflection on (001) plane and as analyzed by RHEED exhibits a spotty or streaky pattern, then this film is regarded to be a (001) epitaxial film. The same applies to a (111) epitaxial film.

The perovskite structure is represented by the chemical formula $ABO_3$ wherein A and B stand for cations positioned at A and B sites in the perovskite type crystal structure, respectively. A is preferably at least one member selected from the group consisting of Ca, Ba, Sr, Pb, K, Na, Li, La, and Cd, and B is preferably at least one member selected from the group consisting of Ti, Zr, Ta, and Nb.

In such perovskite type compounds, the molar compositional ratio of A/B ranges from 0.8/1 to 1.2/1, preferably from 0.9/1 to 1.1/1. An A/B ratio in this range ensures that dielectric materials be insulating and be improved in crystallinity, leading to improvements in dielectric or ferroelectric characteristics. In contrast, an A/B ratio of less than 0.8 renders crystallinity improvement less expectable and an A/B ratio of more than 1.2 tends to make it difficult to form a homogeneous thin film. Such a A/B compositional ratio is accomplished by controlling film deposition conditions as will be described later. The stoichiometry of O in the above-mentioned $ABO_3$ is not limited to 3. There may be some perovskite materials having a perovskite structure which becomes stable for lack or excess of oxygen. In $ABO_x$, x preferably ranges from 2.7 to 3.3. The A/B compositional ratio can be determined by fluorescent X-ray analysis.

The perovskite type compound used herein may be any of $A^{1+}B^{5+}O_3$, $A^{2+}B^{4+}O_3$, $A^{3+}B^{3+}O_3$, $A_xBO_3$, $A(B'_{0.67}B''_{0.33})O_3$, $A(B'_{0.33}B''_{0.67})O_3$, $A(B_{0.5}^{+3}B_{0.5}^{+5})O_3$, $A(B_{0.5}^{2+}B_{0.5}^{6+})O_3$, $A(B_{0.5}^{1+}B_{0.5}^{7+})O_3$, $A^{3+}(B_{0.5}^{2+}B_{0.5}^{4+})O_3$, $A(B_{0.25}^{1+}B_{0.75}^{5+})O_3$, $A(B_{0.5}^{3+}B_{0.5}^{4+})O_{2.75}$, $A(B_{0.5}^{2+}B_{0.5}^{5+})O_{2.75}$, etc.

More illustratively, included are $CaTiO_3$, $BaTiO_3$, $PbTiO_3$, $KTaO_3$, $BiFeO_3$, $NaTaO_3$, $SrTiO_3$, $CdTiO_3$, $KNbO_3$, $LiNbO_3$, $LiTaO_3$, PZT ($PbZrO_3$-$PbTiO_3$), PLZT ($PbZrO_3$-$PbTiO_3$ with $La_2O_3$ added), other lead family perovskite compounds, bismuth family perovskite compounds, and solid solutions thereof.

PLZT is a compound wherein PZT which is a $PbZrO_3$-$PbTiO_3$ solid solution is doped with La and when expressed in the form of $ABO_3$, $A=Pb_{0.89-0.91}La_{0.11-0.09}$ and $B=Zr_{0.65}Ti_{0.35}$. It is then expressed by $(Pb_{0.89-0.91}La_{0.11-0.09})(Zr_{0.65}Ti_{0.35})O_3$.

The preferred perovskite compounds used herein are titanate salts or titanate-containing perovskite type compounds, for example, $BaTiO_3$, $SrTiO_3$, PLZT, PZT, $CaTiO_3$, and $PbTiO_3$.

The tungsten bronze type structure is represented by the chemical formula $AB_2O_6$ wherein A and B stand for cations positioned at A and B sites in the tungsten bronze type crystal structure, respectively. A is preferably at least one member selected from the group consisting of Ca, Ba, Sr, Pb, K, Na, Li, Cd, Sc, Y, and rare earth elements, and B is preferably at least one member selected from the group consisting of Nb, Ta, Ti, and Zr.

In such tungsten bronze type compounds, the molar compositional ratio of A/B ranges from 0.3/1 to 0.7/1, preferably from 0.4/1 to 0.6/1. An A/B ratio in this range ensures that dielectric materials be insulating and be improved in crystallinity, leading to improvements in dielectric or ferroelectric characteristics. In contrast, an A/B ratio of less than 0.3 renders crystallinity improvement less expectable and an A/B ratio of more than 0.7 tends to make it difficult to form a homogeneous thin film. Such a A/B compositional ratio is accomplished by controlling film deposition conditions as will be described later. The stoichiometry of O in the above-mentioned $AB_2O_6$ is not limited to 6. There may be some tungsten bronze materials having a tungsten bronze structure which becomes stable for lack or excess of oxygen. In $AB_2O_x$, x preferably ranges from 5.6 to 6.3. The A/B compositional ratio can be determined by fluorescent X-ray analysis.

The tungsten bronze type compound used herein may be any of the tungsten bronze type compounds described in Landoit-Borenstein, Vol. 16, which is a ferroelectric material data book. More illustratively, included are $(Ba,Sr)Nb_2O_6$, $PbNb_2O_6$, $(P,Ba)Nb_2O_6$, $PbTa_2O_6$, $BaTa_2O_6$, $PbNb_4O_{11}$, $PbNb_2O_6$, $SrNb_2O_6$, $BaNb_2O_6$, and solid solutions thereof.

Preferred among the above-mentioned perovskite and tungsten bronze type compounds are barium titanate, strontium titanate, PZT, SBN ($(Ba,Sr)Nb_2O_6$), and PBN ($(P,Ba)Nb_2O_6$). The oriented thin film is preferably an epitaxial film.

The substrate used herein is a single crystal and may be a semiconductor such as gallium arsenide and silicon. Preferred among others is a single crystal silicon substrate. A silicon single crystal is preferably used such that its (100) plane becomes a substrate surface.

The crystal axis orientation relationship between the oriented thin film and silicon is preferably perovskite or tungsten bronze [100]//Si [100].

According to a second aspect of the invention, the multilayer thin film includes an oriented thin film which is formed on a silicon single crystal substrate of silicon single crystal preferably having a Si (100) plane at its surface from a perovskite or tungsten bronze type material, is an epitaxial film, and has a crystal axis orientation relationship of perovskite or tungsten bronze [100]//Si [100]. The oriented thin film is formed on the silicon single crystal substrate directly or via another thin film.

The perovskite or tungsten bronze type material is preferably barium titanate, strontium titanate, PZT, SBN or PBN. Preferably, between the silicon single crystal substrate and the oriented thin film is interposed an oxide thin film including at least one epitaxial thin film composed mainly of zirconium oxide or zirconium oxide stabilized with a rare earth metal element (inclusive of scandium and yttrium).

According to a third aspect of the invention, the multilayer thin film includes on a semiconductor single crystal substrate an oriented thin film which is an epitaxial film formed of a tungsten bronze type material. The oriented thin film is formed on the semiconductor single crystal substrate directly or via another thin film.

The material of the oriented thin film is preferably SBN or PBN. Preferably, between the semiconductor single crystal substrate and the oriented thin film is interposed an oxide thin film including at least one epitaxial thin film composed mainly of zirconium oxide or zirconium oxide stabilized with a rare earth metal element (inclusive of scandium and yttrium). The semiconductor single crystal substrate is preferably a silicon single crystal substrate having a Si (100) plane at its surface.

According to a fourth aspect of the invention, the multilayer thin film includes an epitaxial thin film formed on a semiconductor single crystal substrate and composed mainly of zirconium oxide or zirconium oxide stabilized with a rare earth metal element (inclusive of scandium and yttrium) and an oriented thin film which is formed directly on the epitaxial thin film without an intervening layer from a perovskite or tungsten bronze type material and which is an epitaxial film.

The perovskite or tungsten bronze type material is preferably barium titanate or strontium titanate of perovskite type. The semiconductor single crystal substrate is preferably a silicon single crystal substrate and the crystal axis orientation relationship between the oriented thin film and the silicon single crystal substrate is preferably perovskite or tungsten bronze [100]//Si [100].

According to a fifth aspect of the invention, the multilayer thin film includes on a silicon single crystal substrate having a Si (100) plane at its surface an oriented thin film which is an epitaxial film formed of at least one metal selected from the group consisting of Pt, Ir, Os, Re, Pd, Rh, and Ru or conductive oxide with its c-plane or a-plane unidirectionally oriented parallel to the substrate surface.

Preferably, between the silicon single crystal substrate and the oriented thin film is interposed an oxide thin film including at least one epitaxial thin film composed mainly of zirconium oxide or zirconium oxide stabilized with a rare earth metal element (inclusive of scandium and yttrium).

According to a sixth aspect of the invention, the multilayer thin film includes on a silicon single crystal substrate of silicon single crystal having a Si (100) plane at its surface an epitaxial film formed of at least one metal selected from the group consisting of Pt, Ir, Os, Re, Pd, Rh, and Ru or conductive oxide, and an oriented thin film formed of a perovskite or tungsten bronze type material.

The perovskite or tungsten bronze type material is preferably barium titanate, strontium titanate, PZT, SBN or PBN. The oriented thin film is preferably an epitaxial film.

The crystal axis orientation relationship between the silicon substrate and the oriented thin film is preferably perovskite or tungsten bronze [100]//Si [100].

Preferably, between the silicon single crystal substrate and the metal oriented thin film is interposed an oxide thin film including at least one epitaxial thin film composed mainly of zirconium oxide or zirconium oxide stabilized with a rare earth metal element (inclusive of scandium and yttrium).

Preferably, the crystal axis orientation relationship among the silicon single crystal substrate, the metal oriented thin film, and the oriented thin film is perovskite or tungsten bronze [100]//metal [100]//Si [100]. The oxide thin film takes (001) orientation.

All the above-mentioned multilayer thin films according to the first to sixth aspects involve the following preferred embodiments.

The oxide thin film may be an oxide thin film of two or multi-layer structure including at least an epitaxial film composed mainly of zirconium oxide or zirconium oxide stabilized with a rare earth metal element (inclusive of scandium and yttrium) and another epitaxial film formed thereon of a perovskite type material. The perovskite type material used herein is preferably composed mainly of barium titanate or strontium titanate. The crystal orientation relationship between the perovskite type material and the silicon substrate is preferably perovskite [100]//Si [100]. This perovskite/film composed mainly of zirconium oxide or zirconium oxide stabilized with a rare earth metal element/ silicon structure is effective for improving the crystallinity of an oriented film to be formed thereon, for example, films of ferroelectric materials such as PZT and SBN and electrode films of Pt for thereby producing a c-plane unidirectionally oriented or epitaxial film. The structure also functions as the insulator of a so-called MFIS structure of metal-ferroelectric-insulator-semiconductor and MFMIS structure of metal-ferroelectricmetal-insulator-semiconductor.

The epitaxial film composed mainly of zirconium oxide or zirconium oxide stabilized with a rare earth metal element (inclusive of scandium and yttrium) serving as the oxide thin film preferably consists essentially of $ZrO_2$ or stabilized zirconia having a rare earth element (inclusive of scandium and yttrium) added thereto. The additive rare earth element used in stabilized zirconia is preferably selected from Y, Pr, Ce, Nd, Gd, Tb, Dy, Ho, and Er. The $ZrO_2$ film should preferably contain at least 93 mol %, more preferably at least 95 mol %, especially at least 98 mol %, further especially at least 99.5 mol % of Zr, based on the amount of only constituent elements excluding oxygen. The higher the purity, the higher is the insulating resistance and the less is the leakage current. Then the film is more suitable for use as the intermediate layer requiring insulating nature. $ZrO_2$ is especially preferred as the intermediate layer because when a metal-insulator-semiconductor structure (MIS structure) is constructed from $ZrO_2$, its C-V curve contains less hysteresis and its interface properties as an MIS element are superior as compared with YSZ. The upper limit of the Zr content is currently 99.99%. The $ZrO_2$ film may contain less than 7 mol % of impurities such as rare earth alloys and phosphorus. An oxide intermediate layer having improved crystallinity and surface flatness is preferred.

The preferred composition of zirconium oxide stabilized with a rare earth metal element (inclusive of scandium and yttrium) forming the oxide thin film is $Zr_{1-x}R_xO_{2-\delta}$ wherein R is a rare earth metal element inclusive of scandium and yttrium, x ranges from 0 to 0.75, and δ ranges from 0 to 0.5.

The oxide thin film layer is preferably such that a rocking curve of (002) reflection has a half-value width of up to 1.50°. The lower limit is currently about 0.7°.

The oxide intermediate layer has a ten point mean roughness Rz of up to 2 nm across a reference length of 500 nm over at least 80% of its surface.

There has been described a multilayer thin film according to the invention which has a basic structure comprising an oxide thin film optionally formed on a semiconductor single crystal substrate and an oriented thin film formed on the oxide thin film.

Preferably, the oxide thin film includes at least one epitaxial film or layer having the composition: $Zr_{1-x}R_xO_{2-\delta}$ wherein R is yttrium or a rare earth metal element inclusive of scandium and yttrium, x ranges from 0 to 0.75, and $\delta$ ranges from 0 to 0.5; and on this oxide thin film, an oriented thin film having a crystal structure: perovskite structure and a composition: $BaTiO_3$, etc. is sequentially stacked whereby a structure having a plane orientation relationship: $BaTiO_3$ (001) // $Zr_{1-x}R_xO_{2-\delta}$ (001)//Si (001) and a crystal axis orientation: $BaTiO_3$ [100]//$Zr_{1-x}R_xO_{2-\delta}$ [100]//Si [100] is constructed.

It is estimated from prior art examples such as YBCO that in producing a $BaTiG_3$ epitaxial film of (001) orientation, since the plane orientation relationship is $BaTiO_3$ (001)// $Zr_{1-x}R_xO_{2-\delta}$ (001)//Si (001) and $BaTiO_3$ [110]//$Zr_{1-x}R_xO_{2-\delta}$ [100]//Si [100], epitaxial growth takes place when a lattice matching is achieved by rotating the unit lattice of $BaTiO_3$ within c plane 45° with respect to the lattice of $Zr_{1-x}R_xO_{2-\delta}$. However, our experiment revealed it difficult to establish such a plane relationship and we have found a possibility of construction with the relationship: $BaTiO_3$ (001)//$Zr_{1-x}R_xO_{2-\delta}$ (001)//Si (001) and $BaTiO_3$ [100]//$Zr_{1-x}R_xO_{2-\delta}$ [100]//Si [100].

More specifically, the $Zr_{1-x}R_xO_{2-\delta}$ and $BaTiO_3$ films have a lattice constant of 0.52 and 0.40 for axis a, respectively. With the relationship: $BaTiO_3$ [110]//$Zr_{1-x}R_xO_{2-\delta}$ [100]//Si [100] which allows for a lattice matching by 45° in-plane rotation, the misfit amounts to 8.4%. In contrast, with the lattice matching relationship: $BaTiO_3$ [100]//$Zr_{1-x}R_xO_{2-\delta}$ [100]//Si [100] according to the invention, an a-plane of $BaTiO_3$ crystal and an a-plane of $Zr_{1-x}R_xO_{2-\delta}$ crystal match with each other without rotation whereupon four lattices of $BaTiO_3$ (0.4×4=1.60 nm) match with three lattices of $Zr_{1-x}R_xO_{2-\delta}$ (0.52×3=1.56 nm). At this time, the misfit is 2.6%, indicating good matching. Accordingly, the present invention has succeeded in obtaining epitaxial $BaTiO_3$ of (001) orientation by utilizing the relationship: $BaTiO_3$ [100]/$Zr_{1-x}R_xO_{2-\delta}$ [100]//Si [100].

Desirably, the oxide thin film has a single crystal orientation. This is because a thin film having a plurality of crystal planes contains grain boundaries, on which epitaxial growth of an oriented thin film is unfeasible.

In order to form a $BaTiO_3$ film as an oriented thin film on the oxide thin film, it is desirable that the oxide thin film have as high crystallinity as possible and a surface which is flat on the molecular level.

The crystallinity of the oxide thin film can be examined in terms of a half-value width of a rocking curve of a reflection peak in X-ray diffraction (XRD) or an image pattern by reflection high energy electron diffraction (to be referred to as RHEED, hereinafter). The surface flatness can be examined in terms of the streakiness of a RHEED image and surface roughness (ten point mean roughness) as measured by an atomic electron microscope (to be referred to as AFM, hereinafter).

Preferably the oxide thin film of the invention is such that a rocking curve of reflection on a (002) plane of the film has a half-value width of up to 1.50° and the film has a surface roughness (ten point mean roughness Rz) of up to 2 nm across a reference length of 500 nm over at least 80%, preferably at least 90%, especially at least 95% of its surface as measured by AFM. The percentage is a value obtained by carrying out measurement at arbitrary 10 or more points evenly distributed over the entire surface of the thin film. An RHEED image of the oxide thin film is highly streaky. That is, the RHEED image contains many sharp streaks.

These facts prove that the oxide thin film of the invention is improved in both crystallinity and surface flatness. It is noted that no particular lower limit is imposed on the half-value width of a rocking curve and the ten point mean roughness Rz across a reference length of 500 nm and the lower the better they are. At present, the lower limit values are about 0.7° for the half-value width of a rocking curve and about 0.1 nm for the ten point mean roughness Rz.

The crystallinity of an oxide epitaxial film used as the oxide thin film depends on the range of x. As reported in Jpn. J. Appln. Phys., 27, 8, L1404–L1405 (1988), $Zr_{1-x}R_xO_{2-\delta}$ takes the form of a tetragonal crystal in the small x region where x is less than 0.2, but a cubic crystal in the larger x region. Although epitaxial films of unidirectional orientation have been obtained in the cubic crystal region, no epitaxial films of unidirectional orientation have been obtained in the small x region where x is less than 0.2, due to concomitant formation of planes other than the desired orientation plane as described in J. Appl. Phys., 58, 6, 2407–2409 (1985).

Accordingly, the oxide thin film crystals should preferably be of the cubic system. The reason is that since the multilayer oxide thin film of the present invention allows an oriented thin film to form on the surface thereof, unidirectionally oriented crystals are more likely to form on cubic crystals than on tetragonal crystals at the oxide thin film surface to help an oriented thin film epitaxially grow thereon.

In the region where x exceeds 0.75, on the other hand, the film is of cubic crystals, with crystal faces other than the objective crystal face being co-present. For example, an attempt to form a (100) epitaxial film of $Zr_{1-x}R_xO_{2-\delta}$ entails formation of (111) crystals in this x region.

More specifically, the ranges where tetragonal and cubic crystals are formed and the range where the objective crystal face is obtained suggest that an epitaxial film which is superior as the oxide thin film is obtainable from $Zr_{1-x}R_xO_{2-\delta}$ when x ranges from 0 to 0.75, preferably from 0.2 to 0.50.

The type of rare earth metal element (inclusive of scandium and yttrium) is selected such that the oxide thin film may have a lattice constant which well matches with the lattice constants of the silicon substrate and an oriented thin film. For example, $Zro_{0.7}R_{0.3}O_{2-\delta}$ where the rare earth metal (inclusive of scandium and yttrium) used is yttrium has a lattice constant of 0.52 nm. This value can change with the value of x. For example, $BaTiO_3$ of an oriented thin film formed on this film has such a lattice that four lattices of $BaTiO_3$ crystals match with three lattices of $Zr_{1-x}R_xO_{2-\delta}$ crystals while such matching can be adjustable with the value of x.

However, the adjustable matching range is limited if it is under the control of x. Then matching is achievable by changing the type of rare earth metal. For example, rare earth Pr is used instead of Y whereby the lattice constant of $Zr_{1-x}R_xO_{2-\delta}$ can be increased to optimize its matching with $BaTiO_3$ crystals. By suitably selecting the type and amount of rare earth element in the oxide thin film in this way, the oxide thin film can be matched with the lattice of an oriented thin film.

Note that zirconium oxide free of oxygen defects is represented by the chemical formula: $ZrO_2$ while the composition of the oxide thin film of the invention is represented by the chemical formula: $Zr_{1-x}R_xO_{2-\delta}$ using $\delta$ because zirconium oxide having a rare earth element inclusive of yttrium added thereto varies its oxygen amount depending on the type, amount and valence of the metal element added. Generally, $\delta$ ranges from 0 to about 0.5.

Particularly when the oxide thin film is an epitaxial film with x in the smaller region of less than 0.2, especially of a high purity $ZrO_2$ composition containing at least 93 mol % of Zr based on the amount of only constituent elements excluding oxygen, a unidirectionally oriented epitaxial film is preferred. Although an epitaxial film which is superior as an insulating layer film is readily available for $Zr_{1-x}R_xO_{2-\delta}$ wherein x ranges from 0 to 0.75, preferably from 0.2 to 0.50 as previously mentioned, no thin film of unidirectional orientation and superior crystallinity and surface flatness as mentioned above has heretofore been available for an epitaxial film of a high purity $ZrO_2$ composition containing at least 93 mol % of Zr.

However, making extensive investigations, we first succeeded in forming a thin film of unidirectional orientation and superior crystallinity and surface flatness as mentioned above which is an epitaxial film of a high purity $ZrO_2$ composition containing at least 93 mol % of Zr based on the amount of only constituent elements excluding oxygen. Within this composition, there has been acknowledged an effect of reducing the residual stresses probably attributable to the difference in coefficient of thermal expansion from the silicon substrate. It is believed that the residual stresses with silicon are reduced by phase transition of $ZrO_2$ since this effect becomes more outstanding with the increasing purity of $ZrO_2$. As compared with the YSZ film, the $ZrO_2$ film has a high film resistance and is thus superior as an insulating film.

The oxide thin film should preferably contain at least 93 mol %, more preferably at least 95 mol %, especially at least 98 mol %, further especially at least 99.5 mol % of Zr, based on the amount of only constituent elements excluding oxygen. The higher the purity, the higher are the insulating properties and the less are the residual stresses.

The upper limit of the Zr content is currently 99.99%. The oxide thin film may contain less than 7 mol % of impurities such as rare earth alloys and phosphorus.

It is to be noted that in the multilayer oxide thin film of the invention, the surface of the silicon single crystal substrate may have been thinly (say, up to about 5 nm) oxidized to form a layer of $SiO_2$ or the like. This is because oxygen in the oxide thin film composed mainly of $ZrO_2$ can sometimes diffuse to the surface of the silicon single crystal substrate. Some film forming methods will leave a silicon oxide layer on the silicon substrate surface during formation of an oxide thin film.

Where the multilayer oxide thin film according to the invention includes an epitaxial film of the above-mentioned composition: $Zr_{1-x}R_xO_{2-\delta}$ as the oxide thin film, disturbance of physical quantities by grain boundaries is avoided and an epitaxial film of $BaTiO_3$ formed thereon as an oriented thin film is improved in crystallinity. It is difficult to form a unidirectionally oriented epitaxial film which is a (001) oriented thin film of $BaTiO_3$ on an oxide thin film having inferior surface flatness and crystallinity. As previously mentioned, concomitant formation of (110) oriented plane or preferential growth of (110) orientation can occur. A (001) oriented epitaxial film of $BaTiO_3$ is obtained only on an oxide thin film having superior surface flatness and crystallinity and under oriented thin film growth conditions to be described later. Once a $BaTiO_3$ thin film of quality is obtained on the oxide thin film, then a perovskite crystal film, tungsten bronze crystal film or metal crystal film of quality can be formed thereon. In this embodiment wherein the entire two-layer structure consisting of an epitaxial film of the composition: $Zr_{1-x}R_xO_{2-\delta}$ and a film of perovskite, especially $BaTiO_3$ is an oxide thin film (underlying layer), an oriented thin film of quality is obtained thereon.

In the case of two layer structure, the oxide thin film and oriented thin film of the multilayer thin film each have a thickness which may vary with a particular application. As the underlying film, the oxide thin film containing Zr preferably has a thickness of about 2 to 50 nm and the oriented thin film preferably has a thickness of about 1 to 50 nm, with a combined thickness ranging from about 3 to 100 nm. In the case of a single layer structure, the oxide thin film containing Zr may have a thickness of about 10 to 200 nm. Note that the oriented thin film of perovskite or tungsten bronze has a thickness of about 20 to 1,000 nm when used as a ferroelectric film.

For use as the underlying layer, both an oxide thin film containing such an amount of Zr as not to adversely affect the crystallinity and surface flatness thereof and a perovskite oriented thin film should desirably be thin. For use as an insulating layer of MFIS and MFMIS structures, the oxide thin film should preferably have a thickness of about 2 to 500 nm since the oxide thin film, especially a thin film composed mainly of $ZrO_2$ is highly insulating. For use as an oxide layer in semiconductor devices, for example, as a dielectric layer of MIS capacitors and a gate oxide layer of MISFET, the oxide thin film should preferably be as thin as 0.5 to 20 nm, especially 1 to 10 nm and the oriented thin film be 5 to 300 nm thick. This choice is made to increase the capacitance of the multilayer thin film as a capacitor.

The oriented film which is formed on the above-mentioned multilayer thin film serving as an oxide thin film of an underlying layer is an epitaxial film mainly having a perovskite structure, on which $BaTiO_3$, $PbTiO_3$, PZT, PLZT, other Pb system perovskite, other Bi system perovskite, and tungsten bronze type oxides such as $(Sr,Ba)Nb_2O_6$ and $(Pb,Ba)Nb_2O_6$ can be formed to provide an MFIS structure according to the invention. Other illustrative examples include high-temperature superconducting films such as Bi system oxide superconducting films and $YBa_2Cu_3O_{7-\delta}$ (YBCO) superconducting films, oxide conductive films such as $La_{1-x}Sr_xCoO_3$ and $La_{1-x}Sr_xCa_xRuO_3$, conductive films of $In_2O_3$, Sn-doped $In_2O_3$ and other oxides, and films of metals and semiconductors such as Pt, Si, Ge, and GaAs.

As previously mentioned, the oxide thin film of a single or multi-layer structure according to the invention is suitable as the insulator of an MFIS structure of metal-ferroelectric-insulator-semiconductor and an MFMIS structure of metal-ferroelectric-metal-insulator-semiconductor. In the MFIS structure, it is acceptable to form an oxide thin film of a single or multi-layer structure on a semiconductor, preferably on a Si (100) plane, and form thereon a dielectric thin film according to the invention or another ferroelectric thin film.

In the MFMIS structure, on the other hand, an oxide thin film preferably of a two-layer structure is provided preferably on a Si (100) plane as an insulating layer (I), a conductive epitaxial film is formed thereon as a metal electrode film, and a ferroelectric thin film according to the invention or another ferroelectric thin film is provided thereon.

The metal electrode thin film is used as an electrode for a ferroelectric thin film and a conductive thin film necessary to construct an MFMIS structure which is necessary for a ferroelectric thin film to be applied as a memory. More specifically, a film of at least one metal selected from the group consisting of Pt, Ir, Os, Re, Pd, Rh, and Ru is formed on a silicon single crystal substrate having a Si (100) plane at its surface as an epitaxial film of (001) or (100) unidirectionally oriented parallel to the substrate surface, and it is used as the metal electrode thin film.

The electrode thin film is preferably of metal, but may be a conductive epitaxial film of a non-metallic material. The conductive epitaxial film functions as an electrode beneath an ferroelectric layer and allows a ferroelectric layer having a lattice well matching with this intermediate layer and high crystallinity to be obtained.

The metal electrode thin film is preferably of Pt, Ir, Os, Re, Pd, Rh, Ru or solid solutions thereof. The conductive oxide film serving as the conductive epitaxial film is preferably of indium-containing oxide or conductive perovskite oxide, especially $In_2O_3$, Sn-doped $In_2O_3$, $(La,Sr)CoO_3$, $(La,Sr,Ca)RuO_3$, $(Ln,Sr)MnO_3$ wherein Ln is a rare earth element, and related compounds thereof. The conductive metal or metal oxide should preferably has a resistivity of $10^{-5}$ to $10^{-2}$ $\Omega$cm in bulk form and a resistivity of $10^{-5}$ to $10^{-2}$ $\Omega$cm in thin film form. Superconducting materials are also acceptable.

The conductive epitaxial film functions as an electrode and plays the role of providing a good matching between the lattice constant of itself and the lattice constant of a ferroelectric layer to be formed on the conductive epitaxial thin film for enabling a high crystallinity ferroelectric layer to be formed thereon. Consequently, the metal electrode thin film or conductive epitaxial film should preferably have improved crystallinity and surface flatness. The metal electrode thin film or conductive epitaxial film is preferably of (001) or (100) oriented crystal, especially (001) or (100) unidirectionally oriented crystal, and more preferably an epitaxial film.

Although the thickness of the metal thin film or conductive epitaxial film varies with its application, it is preferably about 5 to 500 nm, more preferably about 50 to 150 nm thick. The metal electrode thin film or conductive epitaxial film should preferably have a reduced thickness of the order that does not detract from its crystallinity and surface flatness. Particularly when the metal electrode thin film or conductive epitaxial film functions as an electrode, it is preferably about 50 to 500 nm thick.

In either case, some materials allow for epitaxial growth of an oriented film on the underlying layer consisting of the oxide thin film picked up from the multilayer thin film without a need to use the multilayer thin film as an oxide thin film. Nevertheless, when the multilayer oxide thin film is used as the oxide thin film, an oriented film of higher quality is obtained thereon because the underlying film is of perovskite structure.

The electronic device substrate according to the invention can be a large area substrate having a uniform multilayer oxide thin film as mentioned above, for example, a substrate having an area of at least 10 cm². Then not only the substrate, but electronic devices fabricated using it become less expensive than in the prior art. No particular upper limit need be imposed on the substrate area while the substrate area may accommodate the current mainstream semiconductor process using silicon wafers of 2 to 8 inches, typically 6 inches. Instead of forming the multilayer thin film over the entire surface of a substrate, it is possible to form the multilayer thin film on only a selected area of a substrate by partial masking insofar as the substrate is 2 to 8 inches.

Next, the method for forming an oxide thin film according to the present invention is described in detail.

In the practice of the method of the invention, an evaporation apparatus 1 as shown in FIG. 1 is desirably used.

The evaporation apparatus 1 includes a vacuum chamber 1a in which a holder 3 for holding a single crystal substrate 2 at a lower side thereof is disposed. The holder 3 is connected to a motor 5 through a rotating shaft 4 so that the motor 5 may drive the holder 3 to rotate the single crystal substrate 2 within its plane. A heater 6 is built in the holder 3 for heating the single crystal substrate 2.

The evaporation apparatus 1 also includes an oxidizing gas supply 7 having an oxidizing gas supply port 8 disposed immediately below the holder 3. Then an oxidizing gas is supplied so as to establish a high partial pressure in the proximity of the single crystal substrate 2. Disposed below the holder 3 are a barium evaporation section 9, a titanium evaporation section 10, a zirconium evaporation section 11, and a rare earth metal (inclusive of scandium and yttrium) evaporation section 12, which include respective metal sources and energy supply means for supplying evaporating energy to the metal sources, such as electron beam emitters. Note that P in FIG. 1 designates a vacuum pump.

In the method for forming a multilayer oxide thin film according to the invention, a silicon single crystal substrate is first mounted in the holder. The single crystal substrate used herein is a single crystal substrate of silicon and its (100) plane is selected as the substrate surface on which an intended oxide thin film is to be formed. Such a choice is made in order that a functional film to be formed on the substrate surface be an epitaxially grown single crystal having an appropriate orientation. It is understood that the substrate surface is preferably a mirror finished wafer which has been cleaned by etching. Etching for cleaning is done using an aqueous solution of 40% ammonium fluoride.

On this substrate, an epitaxial film composed mainly of $ZrO_2$ is formed as an oxide thin film by the method proposed by us in Japanese Patent Application No. 93024/1995.

In forming an oxide thin film according to the invention, the method described in the preceding Patent Application can be used. Below, the method for forming an oxide thin film is first described, and the method for forming an oriented thin film thereon is then described.

Reference is now made to an example using a $ZrO_2$ thin film as the oxide thin film and a $BaTiO_3$ thin film as the oriented thin film.

First, the method for forming an oxide thin film is described. The method starts with mounting the single crystal substrate in the holder. Since the single crystal silicon substrate as cleaned is highly reactive, it is treated on the surface as follows for the purposes of protecting the substrate surface and allowing a satisfactory epitaxial film composed mainly of $ZrO_2$ to grow.

First the single crystal silicon substrate as cleaned on its surface is placed in a vacuum chamber and heated while introducing an oxidizing gas, thereby forming a silicon oxide layer on the surface of the single crystal silicon substrate. The oxidizing gas used herein may be oxygen, ozone, atomic oxygen, and $NO_2$. Since the cleaned surface of the single crystal silicon substrate is highly reactive as mentioned above, the silicon oxide layer is used as a protective film for protecting the single crystal silicon substrate's surface from rearrangement and contamination. The silicon oxide layer is preferably about 0.2 to 10 nm thick. A layer of less than 0.2 nm thick provides incomplete protection of the silicon surface. The reason for the upper limit of 10 nm is described later.

The heating of the substrate includes holding at 300° to 700° C. for 0 to about 10 minutes. The heating rate is about 30° to 70° C./min. With higher temperatures or quicker heating rates, formation of a silicon oxide film is insufficient. Conversely, with lower temperatures or longer holding times, a silicon oxide film becomes too thick.

Introduction of an oxidizing gas is preferably carried out, where oxygen is used as the oxidizing gas, for example, by first evacuating the vacuum chamber to a vacuum of about $1\times10^{-7}$ to $1\times10^{-4}$ Torr and introducing the oxidizing gas to establish an atmosphere having an oxygen partial pressure of $1\times10^{-4}$ Torr at least in the proximity of the single crystal silicon substrate. The oxygen partial pressure of the atmosphere reaches the upper limit where pure oxygen is used, although air may also be used. An oxygen partial pressure of about $1\times10^{-1}$ Torr or lower is especially preferred.

After the above-mentioned step, the substrate is heated in vacuum. Since the silicon surface crystals are protected by the protective film, any contamination, for example, formation of a SiC film by reaction with the residual gas, hydrocarbon is avoided.

Preferably the heating temperature is 600° to 1,200° C., especially 700° to 1,100° C. At temperatures below 600° C., a 1×1 structure to be described later is not available on the surface of the single crystal silicon substrate. At temperatures above 1,200° C., the protective film provides insufficient protection to the silicon surface crystals, allowing the single crystal silicon substrate to be disordered in crystallinity.

Next, zirconium and an oxidizing gas or zirconium, a rare earth metal (inclusive of Y), and an oxidizing gas are supplied to the surface. In this step, the metals including zirconium function to reduce the protective film of silicon oxide formed in the preceding step and extinguish it. At the same time, zirconium and oxygen or zirconium, rare earth metal (inclusive of Y) and oxygen form a 1×1 surface structure on the thus exposed surface of the silicon surface crystals.

Figure 2:
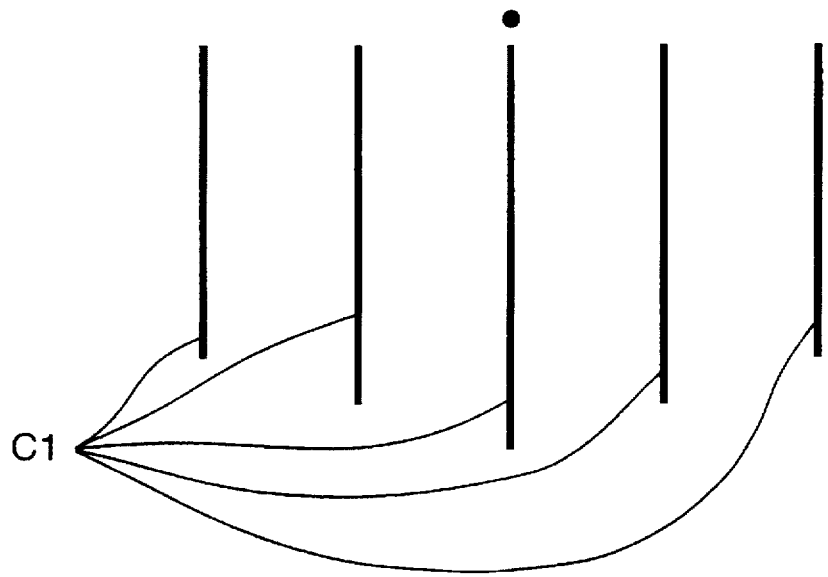
FIG. 2(a) is a diagram showing a RHEED pattern of a 1×1 surface structure.
FIG. 2(b) is a diagram showing a RHEED pattern of a 2×1, 1×2 or mixed surface structure.
Figure 2:
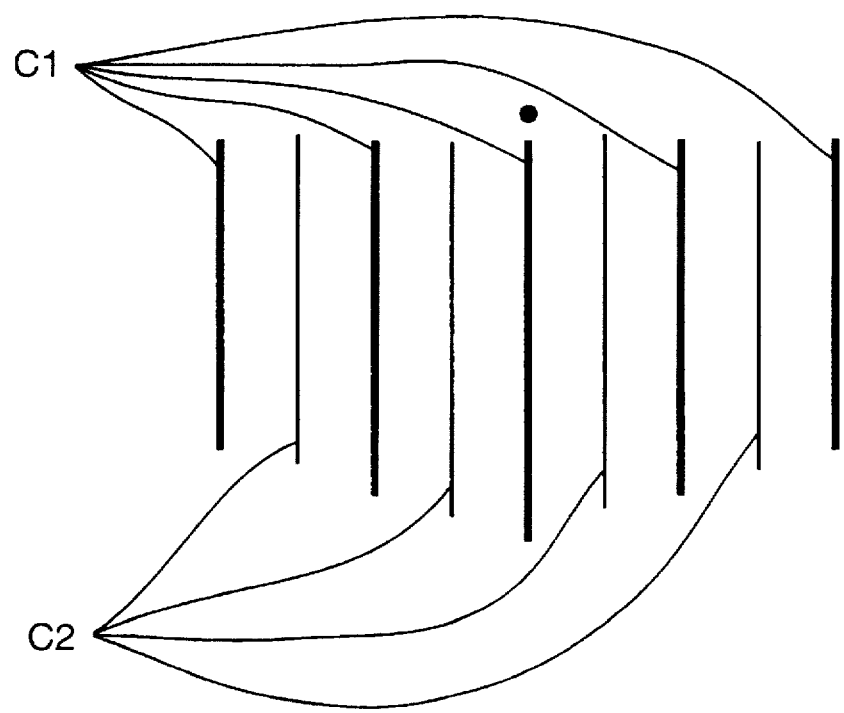

The surface structure can be examined by observing an image pattern by reflection high energy electron diffraction (to be referred to as RHEED, hereinafter). In the case of the 1×1 surface structure the present invention addresses, for example, a pattern of complete streaks having a factor one periodicity C1 as shown in FIG. 2(a) is obtained for electron beam incident direction [110]. The same pattern is obtained for incident direction [1–10]. On the other hand, the cleaned surface of silicon single crystal has a surface structure of 1×2, 2×1 or a mixture of 1×2 and 2×1. In this case, the pattern of a RHEED image is a pattern having a one factor periodicity C1 and a two factor periodicity C2 as shown in FIG. 2(b) for either one or both of electron beam incident directions [110] and [1–10]. In the RHEED pattern of the 1×1 surface structure according to the invention, the two factor periodicity C2 as shown in FIG. 2(b) is not observed in both electron beam incident directions [110] and [1–10].

The cleaned silicon (100) surface sometimes shows a 1×1 structure. It was observed several times in our experiments. The conditions under which a 1×1 structure is available are indefinite, and it is impossible under the current circumstances to produce a 1×1 structure on the cleaned silicon surface in a consistent reproducible manner.

A cleaned silicon surface of a 1×2, 2×1 or 1×1 structure is susceptible to contamination in vacuum at high temperature and especially reacts with hydrocarbons in the residual gas to form SiC on the surface, whereby the crystals on the substrate surface are disordered. This is the reason why it has been impossible to consistently produce a 1×1 structure suitable for crystal growth of an oxide film on a silicon substrate.

The amount of zirconium or zirconium and rare earth metal (inclusive of Y) fed is preferably about 0.3 to 10 nm, especially about 3 to 7 nm calculated as an oxide or oxides thereof. Less than 0.3 nm would not fully exert the effect of reducing silicon oxide. With amounts of more than 10 nm, asperities as observed at the atomic level tend to develop at the surface and such asperities deprive the surface crystal arrangement of the 1×1 structure. The upper limit of the thickness of the silicon oxide layer is 10 nm because above 10 nm, there is a possibility that the metal do not fully reduce the silicon oxide layer even when the metal is fed as above.

Where oxygen is used as the oxidizing gas, it is preferably fed at a rate of about 2 to 50 cc/min. The optimum amount of oxygen fed is determined by the size of the vacuum chamber, evacuation rate of the vacuum pump and other factors and it is recommended to previously determine an optimum flow rate.

The above-mentioned surface treatment of a silicon substrate has the following advantages.

The surface structure covering several atom layers at the crystal surface possess is generally different from the atom arrangement structure of an imaginary surface obtained when a bulk crystal (three-dimensional large crystal) structure is sectioned. Since the surrounding situation of atoms exposed at the surface is changed by the removal of crystals on one side, the exposed atoms accordingly tend to assume a lower energy stable state. As a general rule, this structural change results in a mere relaxation of atom positions in some cases and induces atom recombination to form a rearrangement structure in other cases. The former occurs on most crystal surfaces. The latter generally forms a superlattice structure at the surface. Provided that a and b are the magnitudes of unit vectors of a bulk surface structure, if a superlattice structure having magnitudes ma and nb is created, it is referred to as a m×n structure. The cleaned silicon (100) surface becomes a complex superstructure having a large unit mesh of a 1×2 or 2×1 structure, and the cleaned silicon (111) surface becomes a complex superstructure having a large unit mesh of a 7×7 or 2×8 structure. These cleaned silicon surfaces are highly reactive and especially at the temperature at which an oxide thin film is epitaxially formed (at least 700° C.), tend to react with the residual gases in vacuum, typically hydrocarbons to form SiC at the surface to contaminate the substrate surface and disorder the surface crystals.

In order that oxide epitaxially grow on a silicon substrate, the structure of the silicon surface must be stable and play the role of transmitting the crystal structure information to an oxide film to be grown. For oxide epitaxial film crystals, the atom arrangement structure seemed to appear when a bulk crystal structure is sectioned is a 1×1 structure. Then for the surface structure of a substrate on which an oxide is to be epitaxially grown, a complex superstructure having a large unit mesh of a 1×2, 2×1, 7×7 or 2×8 structure is unfavorable and a stable 1×1 structure is necessary. Since epitaxial growth is carried out at a temperature of 700° C. or higher, it is necessary to protect a reactive silicon surface.

Then, a unidirectionally oriented epitaxial film composed mainly of $ZrO_2$ is formed using a silicon single crystal substrate which has been surface treated as mentioned above.

In forming a unidirectionally oriented epitaxial film composed mainly of $ZrO_2$, a silicon single crystal substrate which has been surface treated is first heated. The heating temperature for film formation is desirably at least 400° C. for crystallization of $ZrO_2$, more desirably at least about 750° C. for improved crystallinity, most desirably at least 850° C. for achieving film crystal surface flatness on the molecular level. The upper limit of the heating temperature of the single crystal substrate is about 1.300° C.

Thereafter, zirconium is heated and evaporated by electron beams or the like. Metallic zirconium and an oxidizing gas are to the single crystal substrate. If necessary, a rare earth metal (inclusive of Y) is similarly supplied. A film composed mainly of $ZrO_2$ is obtained in this way. At this point, the film deposition rate is desirably 0.05 to 1.00 nm/s, especially 0.100 to 0.500 nm/s for the reason that slower rates allow oxidation of the substrate whereas faster rates result in a thin film having poor crystallinity and an irregular surface. Therefore, an optimum value of film deposition rate is determined in accordance with the amount of oxygen introduced.

Then, prior to evaporation of a $ZrO_2$ thin film, the amounts per unit time of metallic zirconium and a rare earth metal (inclusive of Sc and Y) evaporated to form metal and metal oxide deposited films as a function of the power applied to the respective evaporation sources are previously determined and calibrated for each of the metals using a film gage disposed near the substrate within the vacuum evaporation chamber. The oxidizing gas used herein may be oxygen, ozone, atomic oxygen, and $NO_2$. The embodiment using oxygen is described hereinafter. While the vacuum evaporation chamber is continuously evacuated by the vacuum pump, oxygen is continuously injected at a rate of 2 to 50 cc/min., preferably 5 to 25 cc/min. through a nozzle disposed within the chamber to establish an oxygen atmosphere of the order of about $10^{-3}$ to $10^{-1}$ Torr at least in the proximity of the single crystal substrate in the chamber. Since the optimum oxygen amount depends on the size of the chamber, the rate of evacuation of the pump and other factors, an appropriate flow rate is previously determined. The upper limit of the oxygen gas pressure is set at $10^{-1}$ Torr in order that the metal source in the evaporation source in the vacuum chamber be evaporated at a constant rate without deteriorating the metal source. Oxygen gas may be introduced into the vacuum evaporation chamber by injecting oxygen gas toward the surface of the single crystal substrate from the vicinity thereof to establish an atmosphere of a high oxygen partial pressure only in the proximity of the single crystal substrate hereby reaction on the substrate can be more promoted with a smaller amount of oxygen introduced. Since the vacuum chamber is continuously evacuated, the majority of the vacuum chamber is at a low pressure of $10^{-4}$ to $10^{-6}$ Torr.

On a region of the single crystal substrate as narrow as about 1 $cm^2$, oxidation reaction on the single crystal substrate can be promoted by this procedure. In order to form a film on a large single crystal substrate having an area of at least 10 $cm^2$, for example, an area of 2 inches in diameter, the substrate is rotated as shown in FIG. 1 and oxygen under a high partial pressure is supplied to the entire surface of the substrate. Film deposition over a large area is then possible. In this regard, the substrate is preferably rotated at 10 rpm or higher. At slower revolution, a film thickness distribution is created in the substrate plane. The upper limit is not particularly imposed on the revolution of the substrate although it is about 120 rpm because of the mechanical restriction of the vacuum apparatus.

Next, the method for obtaining a multilayer thin film by forming an oriented thin film in the form of a $BaTiO_3$ film, a $SrTiO_3$ film or a $BaTiO_3$ solid-solution film using the epitaxial film composed mainly of $ZrO_2$ as the substrate subject to evaporation. Reference is now made to $BaTiO_3$ as a typical example. The substrate subject to evaporation on which the oxide thin film has been formed is kept heated in the vacuum chamber. Heating is continued while introducing an oxidizing gas.

Next, barium is heated for evaporation by electron beams or the like. Metallic barium and the oxidizing gas are fed to the single crystal substrate. At the same time, titanium is similarly fed. They are fed in such amounts to achieve Ba:Ti=1:1, obtaining a $BaTiO_3$ epitaxial thin film. At this point, the orientation of the $BaTiO_3$ film largely depends on the temperature of the substrate subject to evaporation during film formation and the Ba/Ti feed ratio at the initial of film formation. It is desired that the heating temperature during $BaTiO_3$ film formation is 800° to 1.300° C., preferably 900° to 1.200° C. in order that the $BaTiO_3$ epitaxial crystal have a plane orientation relationship: $BaTiO_3$ (001) //$Zr_{1-x}R_xO_{2-\delta}$ (001)//Si (001) and $BaTiO_3$ [100]//$Zr_{1-x}R_xO_{2-\delta}$ [100]//Si [100]. The initial growth period used herein is when the film has a thickness of 0 to 1 nm.

It is desired that the Ba/Ti feed ratio at the initial growth period is from 0/1 to 1/1, preferably from 0/1 to 0.8/1 in molar ratio. Herein, a Ba/Ti ratio of 0 indicates that only titanium may be fed during the initial growth period. The reason is that if the heating temperature is too low or if the Ba/Ti feed ratio at the initial growth period is inadequate, there would result $BaTiO_3$ having (110) orientation rather than the desired (001) orientation or a (001) oriented $BaTiO_3$ thin film having (110) orientation mixed therein. If the Ba/Ti feed ratio at the initial growth period is too high, barium being fed would react with the underlying $ZrO_2$, failing to form $BaTiO_3$ having the desired orientation. In order to avoid reaction between Ba and $ZrO_2$, it is preferred to feed an excess of titanium during the initial growth period. If the temperature is too high, the multilayer film would lower crystallinity due to inter-diffusion. It is desired that the film deposition rate is 0.05 to 1.00 nm/s, preferably 0.100 to 0.500 nm/s. The reason is that a too slow rate would permit the metal evaporation source to be oxidized with oxygen being introduced so that the evaporation rate might become unstable, failing to achieve a fixed composition. A too fast rate would result in a thin film having poor crystallinity and surface asperities. Therefore, an optimum film deposition rate is determined by the amount of oxygen introduced. Then, prior to evaporation of a $BaTiO_3$ thin film, the amounts per unit time of metallic barium and titanium evaporated to form metal and metal oxide deposited films as a function of the power applied to the respective evaporation sources are previously determined and calibrated for each of the metals using a film gage disposed near the substrate within the vacuum evaporation chamber. It is understood that while A and B site metals are present in other perovskite and tungsten bronze type materials as is well known in the art, the initial feed should preferably be done so as to provide an A/B ratio of from 0/1 to 1/1, especially from 0/1 to 0.8/1 for the perovskite and from 0/1 to 0.5/1 for the tungsten bronze.

The oxidizing gas used herein may be oxygen, ozone, atomic oxygen, and $NO_2$. The embodiment using oxygen is described hereinafter. While the vacuum evaporation chamber is continuously evacuated by the vacuum pump, oxygen is continuously injected at a rate of 2 to 50 cc/min., preferably 5 to 25 cc/min. through a nozzle disposed within the chamber to establish an oxygen atmosphere of the order of about $10^{-3}$ to $10^{-1}$ Torr at least in the proximity of the single crystal substrate in the chamber. Since the optimum oxygen amount depends on the size of the chamber, the rate of evacuation of the pump and other factors, an appropriate flow rate is previously determined. The upper limit of the oxygen gas pressure is set at $10^{-1}$ Torr in order that the metal source in the evaporation source in the vacuum chamber be evaporated at a constant rate without deteriorating the metal source. Oxygen gas may be introduced into the vacuum evaporation chamber by injecting oxygen gas toward the surface of the single crystal substrate from the vicinity thereof to establish an atmosphere of a high oxygen partial pressure only in the proximity of the single crystal substrate whereby reaction on the substrate can be more promoted with a smaller amount of oxygen introduced. Since the vacuum chamber is continuously evacuated, the majority of the vacuum chamber is at a low pressure of $10^{-4}$ to $10^{-6}$ Torr.

On a region of the single crystal substrate as narrow as about 1 $cm^2$, oxidation reaction on the single crystal substrate can be promoted by this procedure. In order to form a film on a large single crystal substrate having an area of at least 10 $cm^2$, for example, an area of 2 inches in diameter, the substrate is rotated as shown in FIG. 1 and oxygen under a high partial pressure is supplied to the entire surface of the substrate. Film deposition over a large area is then possible. In this regard, the substrate is preferably rotated at 10 rpm or higher. At slower revolution, a film thickness distribution is created in the substrate plane. The upper limit is not particularly imposed on the revolution of the substrate although it is about 120 rpm because of the mechanical restriction of the vacuum apparatus. In this way, there is obtained a multilayer thin film according to the invention. It is understood formation of a metal epitaxial film is done by a conventional technique.

While the preparation method has been described in detail, this preparation method is suitable for producing an end product of high completeness to a large area in a reproducible manner because it can be carried out in an atmosphere where no impurities are involved and under easily controllable conditions as will become evident from a comparison with conventional vacuum evaporation, sputtering and laser ablation techniques. When the same method is carried out using a MBE apparatus, an end thin film can be similarly produced.

Further a metal oriented film and an oriented film of a perovskite material other than $BaTiO_3$ or tungsten bronze material may be formed thereon in a multi-layer fashion. In this case, the oriented film may also be formed by an evaporation, sputtering or sol-gel technique.

The thus obtained multilayer oxide thin film and electronic device substrate using the same can be processed by a semiconductor process, without modifying its structure, and constructed as a capacitor and gate for DRAM by substituting for the conventional $SiO_2$. A non-volatile memory may also be constructed by integrating it with FET, etc. by a semiconductor process. By forming silicon on the inventive substrate as a functional film, it can be applied as a SOI device. By forming a functional film of superconducting material on the inventive substrate, it can be applied as infrared sensors, optical modulators, optical switches and OEIC. It may also be applied to SQUID, Josephson devices, superconducting transistors, electromagnetic sensors, and superconducting wire LSIs.

EXAMPLE

Examples of the invention are given below by way of illustration.

Example 1

As the single crystal substrate on which an oxide thin film was to be grown, there were used a silicon single crystal which was cut so as to make (100) plane a surface and mirror polished. After purchase, the mirror surface was cleaned by etching with a 40% ammonium fluoride aqueous solution. The single crystal substrate used was a disk substrate of 5 $\Omega$cm, P type and 2 inches diameter.

The single crystal substrate was secured to a substrate holder equipped with rotating and heating mechanisms installed in a vacuum chamber. The vacuum evaporation chamber was then evacuated to a vacuum of $10^{-6}$ Torr by means of an oil diffusion pump. In order to protect the cleaned surface of the substrate with silicon oxide, the substrate was rotated at 20 rpm and heated at 600° C. while introducing oxygen to the proximity of the substrate from a nozzle at a rate of 25 cc/min. A silicon oxide film was formed on the substrate surface by thermal oxidation. By this procedure, a silicon oxide film of about 1 nm thick was formed.

Thereafter, the substrate was heated at 900° C. and rotated. The number of revolutions was 20 rpm. At this point, oxygen was introduced from a nozzle at a rate of 25 cc/min. Metallic zirconium was evaporated from its evaporation source to supply zirconium onto the substrate in an amount corresponding to a zirconium oxide film of 5 nm thick, yielding a surface treated silicon substrate having a 1×1 surface structure. This surface was measured by RHEED, with the resulting image shown in FIG. 3.

Figure 3:
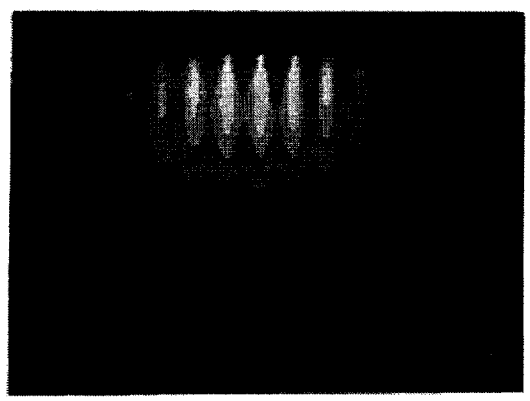
FIG. 3 is a drawing-substituting photograph showing the surface structure of a silicon substrate having a 1×1 surface structure formed of metallic zirconium and oxygen, illustrating a RHEED pattern or a diffraction pattern resulting from an electron beam incident from a silicon single crystal [110] direction.

The pattern of FIG. 3 resulted from measurement in incident direction [110] although exactly the same pattern was obtained with 90° rotation. It was thus acknowledged that there was provided a surface treated silicon substrate having a stable 1×1 surface structure.

By supplying metallic zirconium from its evaporation source onto the surface treated silicon substrate at a temperature of 900° C. and rotating at 20 rpm while introducing oxygen gas from a nozzle at a rate of 25 cc/min., a $ZrO_2$ film of 10 nm thick was formed on the treated substrate.

Figure 4:
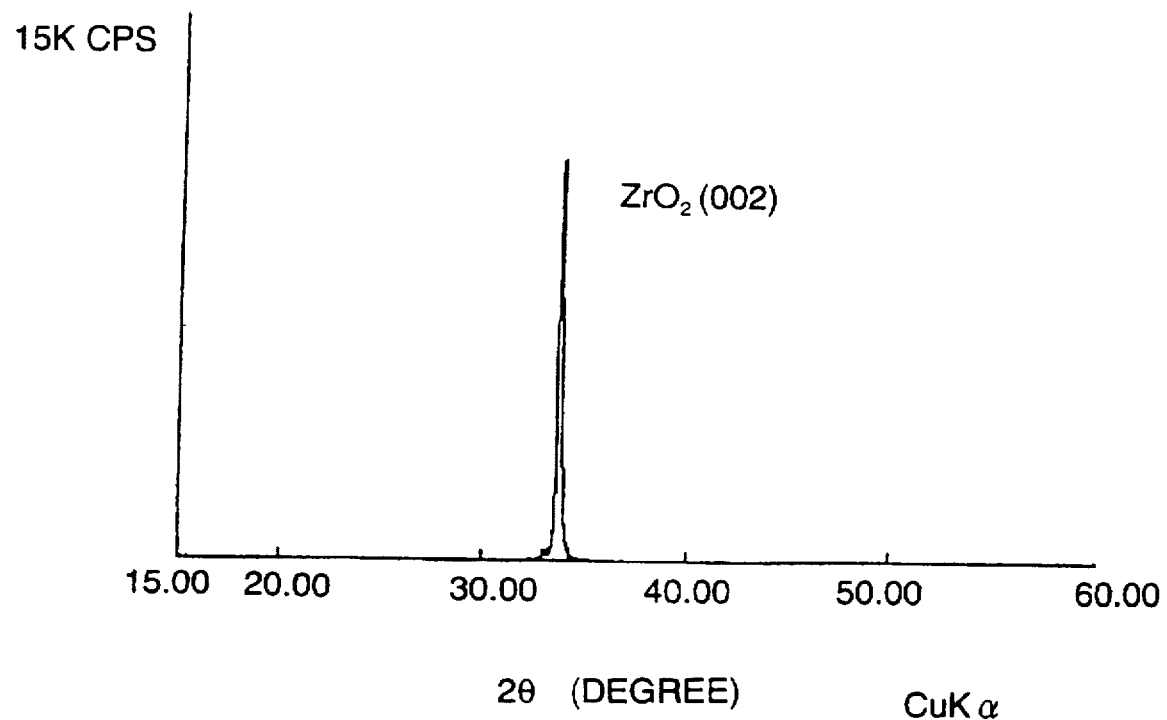
FIG. 4 is an X-ray diffraction diagram of the structure of a $ZrO_2$ film formed on a Si (100) substrate.

FIG. 4 shows the results of X-ray analysis on the resulting thin film. In the figure, a (002) peak of $ZrO_2$ is apparently observed (in FIG. 4). It is seen that there is obtained a crystal film which is intensely oriented in a direction reflecting the crystal structure and symmetry of $ZrO_2$. In particular, each of these peaks is reflection from only one reflecting surface. Especially, the $ZrO_2$ film is a unidirectionally oriented, high crystallinity film which was never found in the prior art. The rocking curve of this reflection had a half-value width of 0.7° (found value), respectively, indicating superior orientation.

Figure 5:
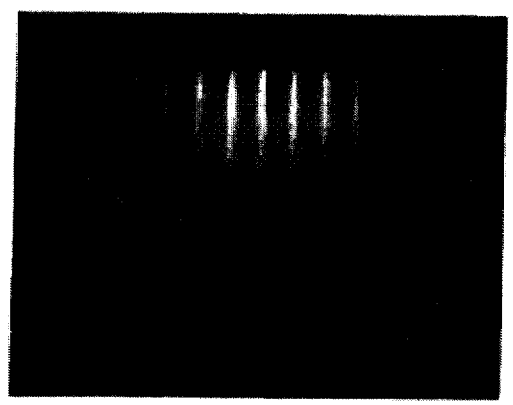
FIG. 5 is a drawing-substituting photograph showing the crystal structure of $ZrO_2$ formed on a Si (100) substrate, illustrating a RHEED diffraction pattern resulting from an electron beam incident from a silicon single crystal [110] direction.

FIG. 5 shows a reflection high energy electron diffraction (RHEED) pattern of this thin film. The electron beam was incident from [110] direction of the silicon substrate. As seen from the results, the diffraction pattern on the surface of the thin film of this structure is a completely streaky pattern. This completely streaky pattern indicates that $ZrO_2$ has superior crystallinity and surface flatness. There was also obtained a YSZ film having substantially the same crystallinity and surface flatness. It was found that the $ZrO_2$ film had a resistivity 5 times higher than that of YSZ, indicating superior insulation. The $ZrO_2$ film was measured for ten point mean roughness Rz according to JIS B-0610 (reference length L=500 nm) at 10 positions distributed over substantially the entire surface to find that it had Rz of 0.70 nm on average, 0.95 nm at maximum, and 0.10 at minimum, indicating that the surface was flat on the molecular level.

While the thus obtained silicon single crystal substrate having the $ZrO_2$ film formed thereon was used as the substrate subject to evaporation, a $BaTiO_3$ film of 300 nm thick was obtained on this substrate subject to evaporation by feeding metallic barium and metallic titanium from their evaporation sources in a ratio of 1:1 onto the substrate under the conditions including substrate temperature 900° C., revolution 200 rpm, oxygen gas flow introduced from nozzle 25 cc/min. After the initial film deposition stage when only titanium was fed in an amount corresponding to a $Tio_2$ film of 0.5 nm thick, metallic barium and metallic titanium were fed in a ratio of 1:1 to deposit $BaTiO_3$ at a rate of 0.05 nm/s until a film thickness of 2 nm was reached and then at an increased deposition rate of 0.2 nm/s.

Figure 6:
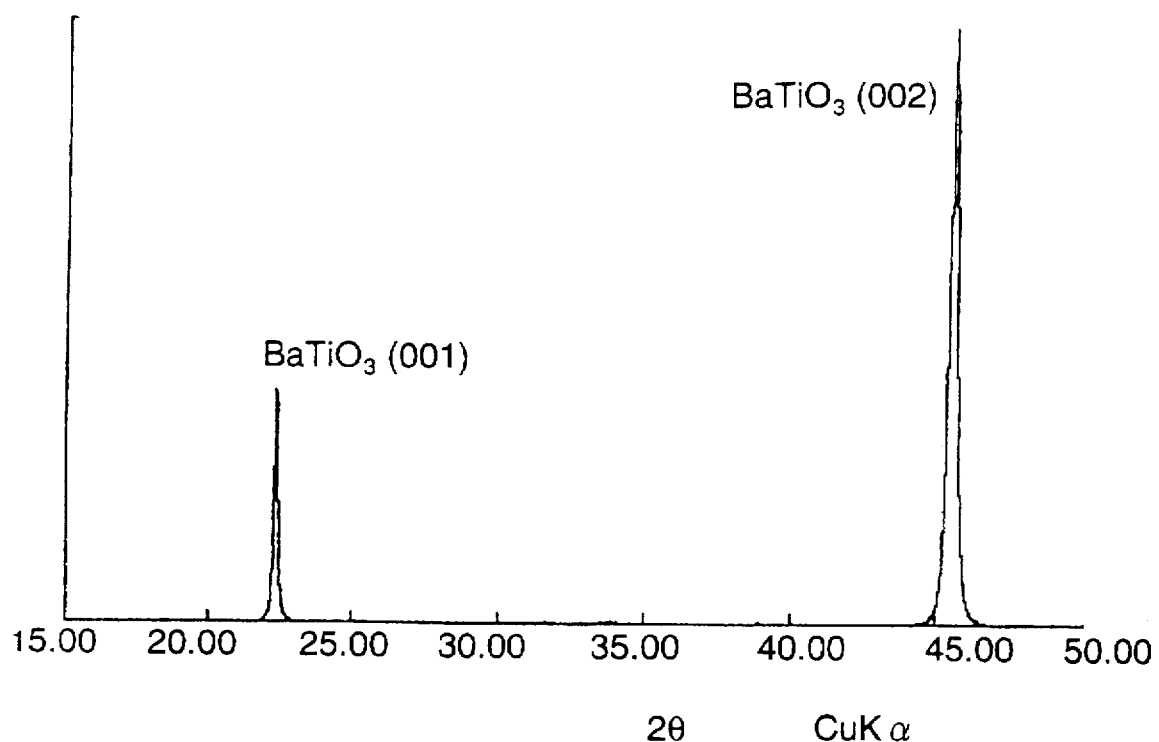
FIG. 6 is an X-ray diffraction diagram of a $BaTiO_3$ film formed on a $ZrO_2(001)$/Si(100) substrate.

FIG. 6 shows the results of X-ray analysis of the $BaTiO_3$ thin film on the $ZrO_2$ film. In FIG. 6, (001) and (002) peaks of $BaTiO_3$ are explicitly observed, indicating that there is obtained a (001) crystal film which is intensely oriented in a direction reflecting the crystal structure and symmetry of the $BaTiO_3$. Especially, each of these peaks is reflection from only one equivalent reflecting plane, indicating a high crystallinity film of unidirectional orientation. The rocking curve of this reflection had a half-value width of 1.4° (found value), indicating superior orientation.

Figure 7:
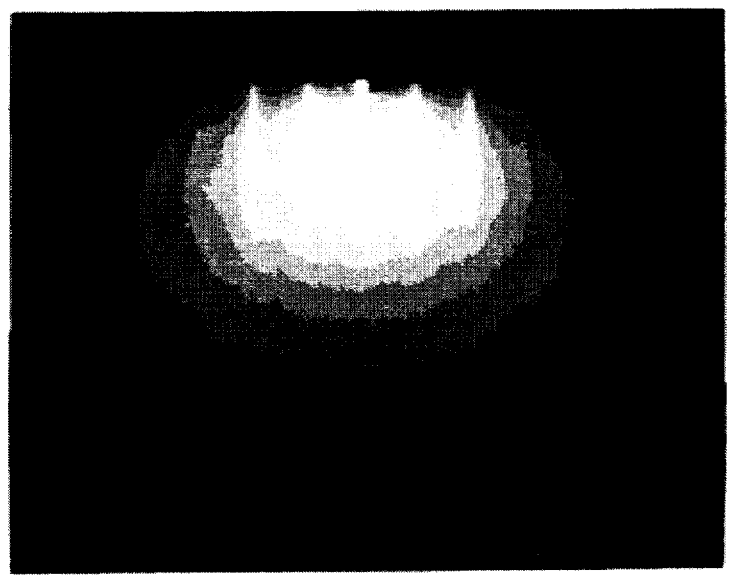
FIG. 7 is a drawing-substituting photograph showing the crystal structure of $BaTiO_3$ formed on a $ZrO_2(001)$/Si(100) substrate, illustrating a RHEED diffraction pattern resulting from an electron beam incident from a silicon single crystal [110] direction.
Figure 8:
FIG. 8 is a section TEM photograph of $BaTiO_3$ formed on a $ZrO_2(001)$/Si(100) substrate.

FIG. 7 shows a RHEED (reflection high energy electron diffraction) pattern of this thin film. The pattern resulted from an incident electron beam in a direction [110] of the silicon substrate. The diffraction pattern on the surface of the thin film of this structure is a completely streaky pattern. This completely streaky pattern indicates that $BaTiO_3$ has superior crystallinity and surface flatness. When a YSZ film and films of ZrO stabilized with rare earth elements (inclusive of Sc and Y) other than yttrium were used instead of the $ZrO_2$ film, there were obtained the same films. FIG. 8 shows a section TEM photograph. In the figure, the silicon substrate, $SiO_2$ layer, $ZrO_2$ layer, and $BaTiO_3$ film are layered from the bottom while their crystal lattices are observable. The $SiO_2$ layer, which is an amorphous film, was probably formed by diffusion of oxygen during formation of the $ZrO_2$ film and $BaTiO_3$ film. This photograph reveals direct epitaxial growth of $BaTiO_3$ on $ZrO_2$ without an intervening layer. It is also seen that $ZrO_2$ lattices and $BaTiO_3$ lattices match with each other at a ratio of 3:4. Further, the silicon substrate, the thin film composed mainly of $ZrO_2$ which is the oxide thin film and the $BaTiO_3$ thin film which is the oriented thin film have a crystal face relationship or plane orientation relationship: $BaTiO_3$ (001)//$Zr_{1-x}R_xO_{2-\delta}$ (001)//Si (001) and $BaTiO_3$ [100]//$Zr_{1-x}R_xO_{2-\delta}$ [100]//Si [100] as acknowledged from the TEM image, XRD and RHEED. The $BaTiO_3$ thin film obtained by the present invention was established for the first time as a (001) $BaTiO_3$ thin film epitaxially grown on the Si substrate. Additionally, films of $SrTiO_3$ and a solid solution of $BaTiO_3$ and $SrTiO_3$ were also prepared by the same method and evaluated by XRD and RHEED, finding that they were completely the same epitaxial films.

Figure 9:
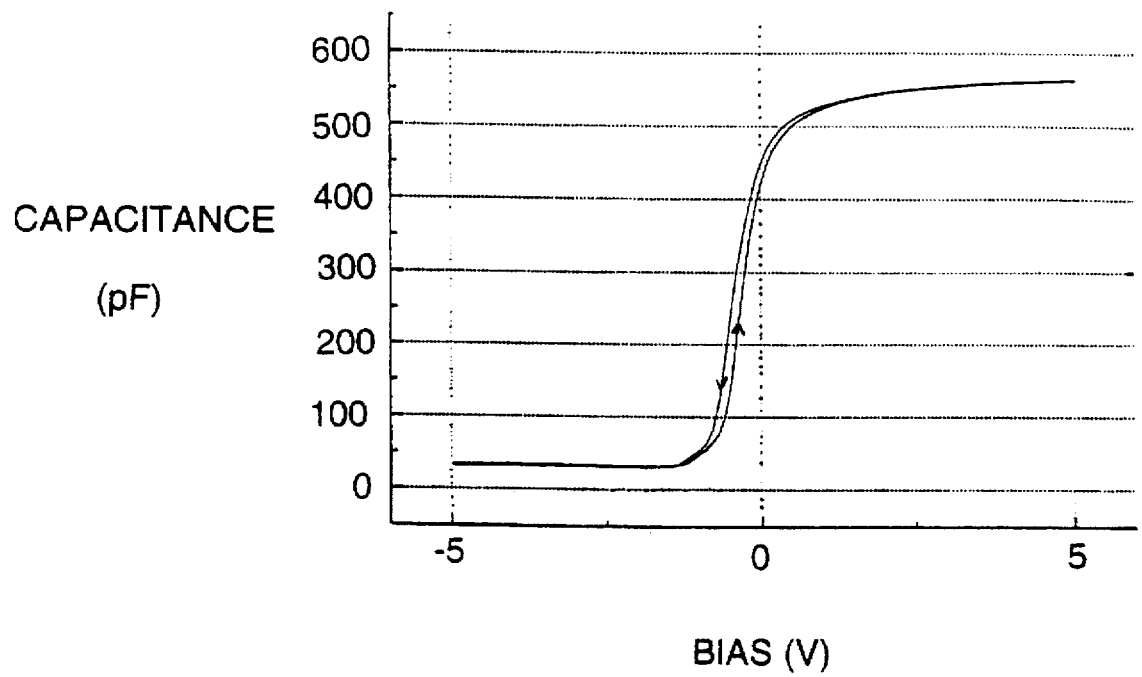
FIG. 9 is a graph showing a C-V curve of an MOS structure consisting of a $BaTiO_3/ZrO_2/Si$ multilayer film.

The multilayer thin film using the thus obtained $BaTiO_3$ was measured for dielectric constant, finding a high value of 1,000. C-V property was measured by forming a platinum electrode on the multilayer film surface and an aluminum electrode on the silicon substrate, resulting in a hysteresis curve as shown in FIG. 9 which has a hysteresis width of 0.2 V. That is, a memory window of 0.2 V was obtained.

By taking advantage of this performance, a device using the multilayer thin film as the gate oxide film of FET was fabricated to confirm memory operation.

Example 2

Figure 10:
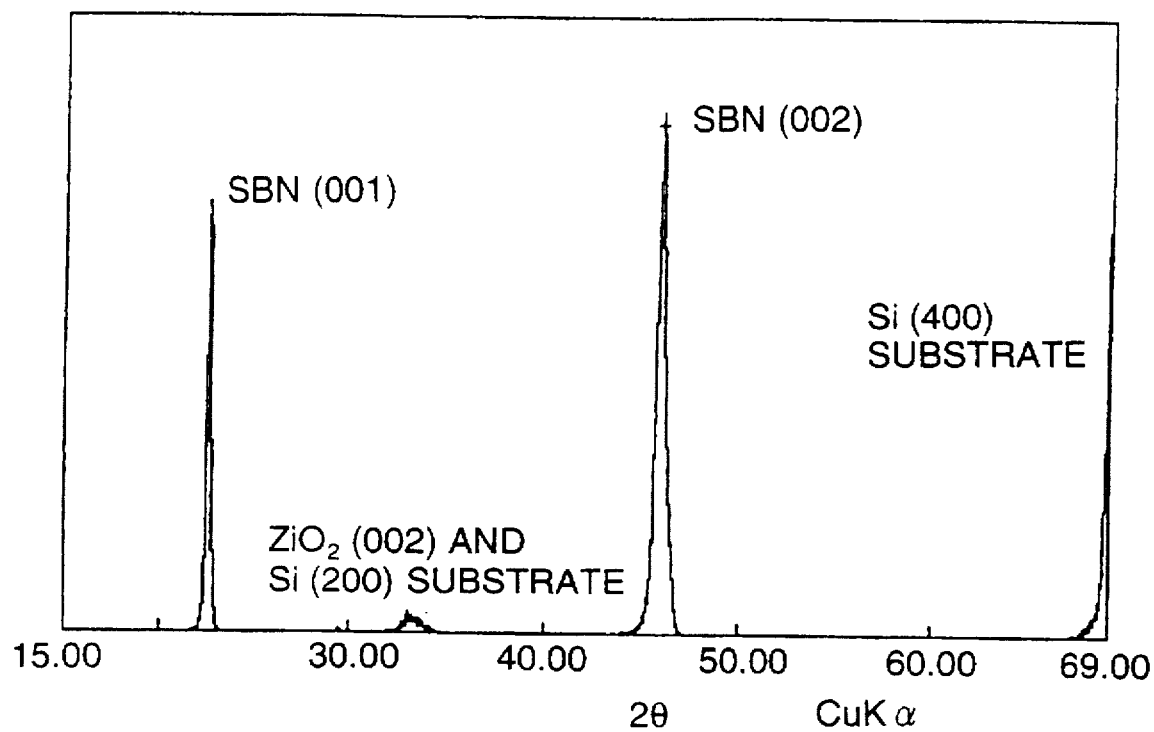
FIG. 10 is an X-ray diffraction diagram of a SBN film formed on a $BaTiO_3(001)/ZrO_2(001)$/Si(100) substrate.
Figure 11:
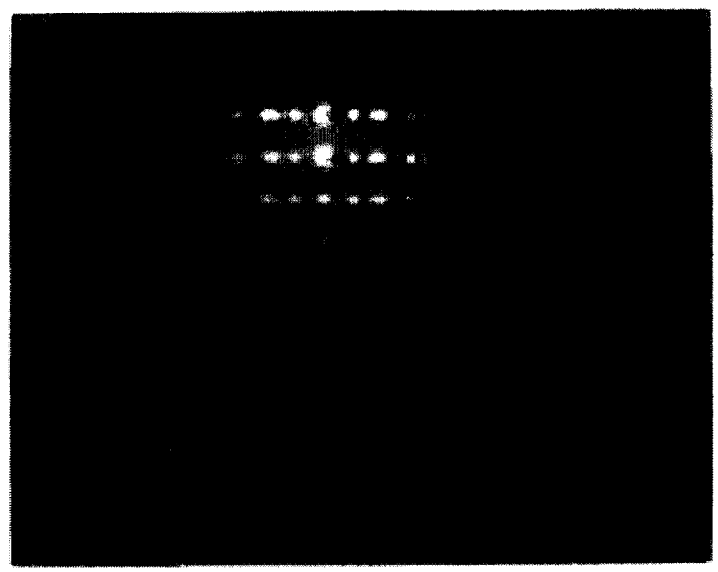
FIG. 11 is a drawing-substituting photograph showing the crystal structure of the SBN film formed on a $BaTiO_3(001)/ZrO_2(001)$/Si(100) substrate, illustrating a RHEED diffraction pattern resulting from an electron beam incident from a silicon single crystal [110] direction.
Figure 12:
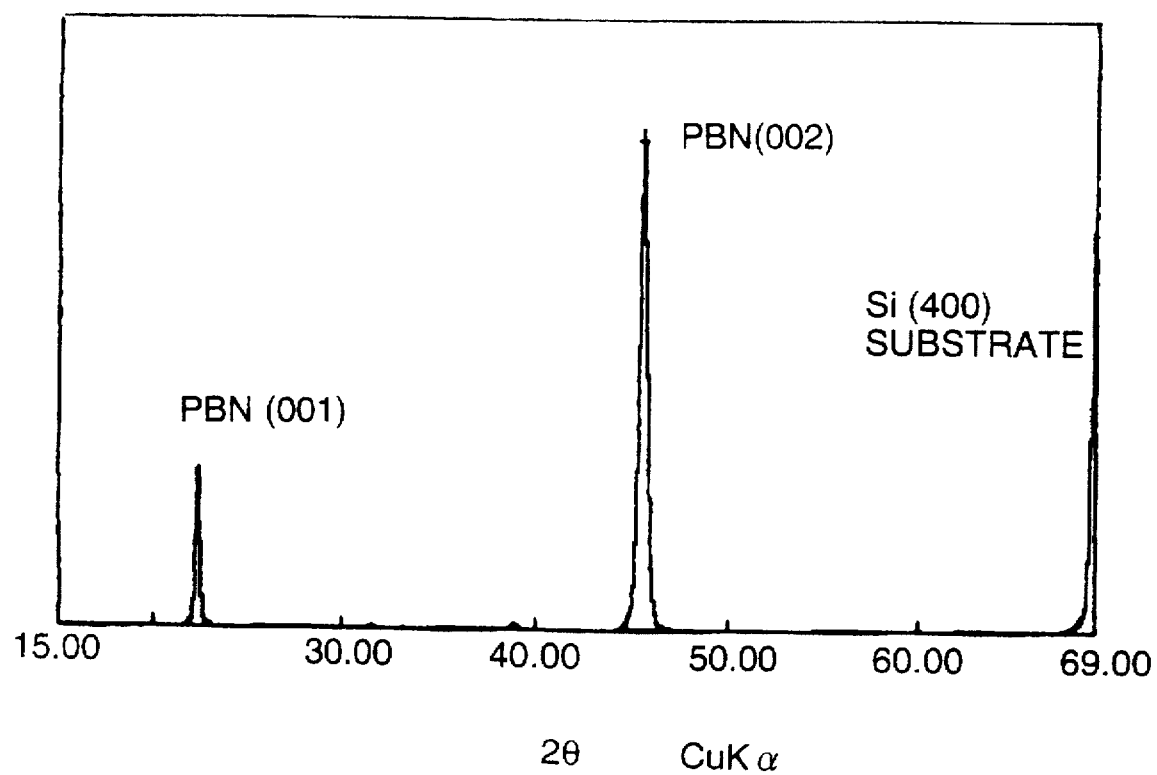
FIG. 12 is an X-ray diffraction diagram of a PBN film formed on a $BaTiO_3/ZrO_2/Si(100)$ substrate.

A multilayer thin film of SBN(001)/$BaTiO_3$(001)/$ZrO_2$ (001)/ Si(100) was obtained as in Example 1 except that a $BaTiO_3$ film was 50 nm thick and a SBN thin film having a thickness of 300 nm and the composition: $Sr_{0.25}Ba_{0.25}O_{0.75}Nb_2O_6$ was formed thereon by sputtering at a substrate temperature of 800° C. FIG. 10 shows the results of X-ray analysis on this thin film. Only reflection by c plane was found, indicating that it was a unidirectionally oriented film. FIG. 11 shows a RHEED pattern of the thin film. The RHEED pattern is not streaky, but indicates that the resultant SBN thin film is an epitaxial thin film having superior crystallinity. Similarly, a multilayer thin film of PBN(001) /$BaTiO_3$(001)/$ZrO_2$(001)/Si(100) was obtained by forming a PBN thin film having the composition: $Pb_{0.38}Ba_{0.62}Nb_2O_3$ instead of the SBN. In the case of PBN, film deposition was done with the substrate temperature set at 650° C. FIG. 12 shows the results of X-ray analysis on the thus obtained thin film. It is seen from the RHEED analysis of the PBN and SBN thin films that their crystal axis orientation relationship to the silicon substrate is SBN[100]//Si[100] and PBN[100] //Si[100].

Example 3

A multilayer thin film of PZT(001)/$BaTiO_3$(001)/$ZrO_2$ (001)/ Si(100) was obtained as in Example 2. A $BaTiO_3$ film was 50 nm thick and a PZT film was 300 nm thick. A crystallized film of PZT was obtained by depositing PZT by sputtering with the substrate temperature set at room temperature and annealing in air at 700° C. for 10 minutes.

Figure 13:
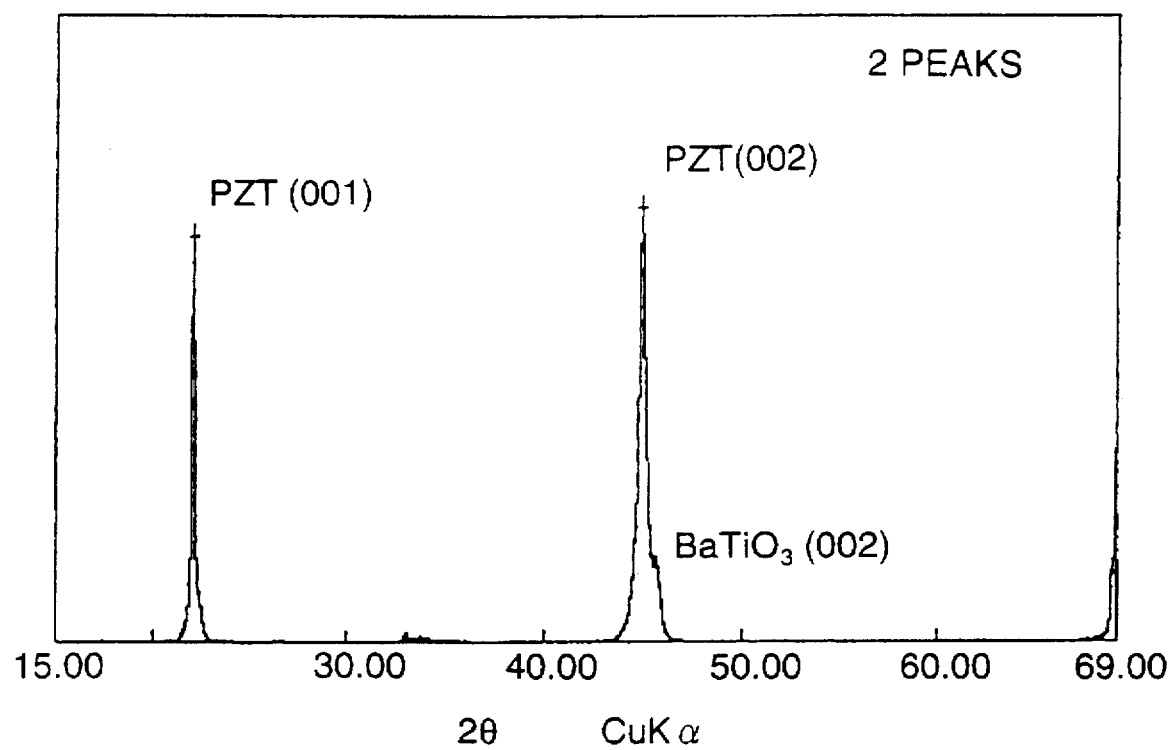
FIG. 13 is an X-ray diffraction diagram of a PZT film formed on a $BaTiO_3(001)/ZrO_2(001)$/Si(100) substrate.
Figure 14:
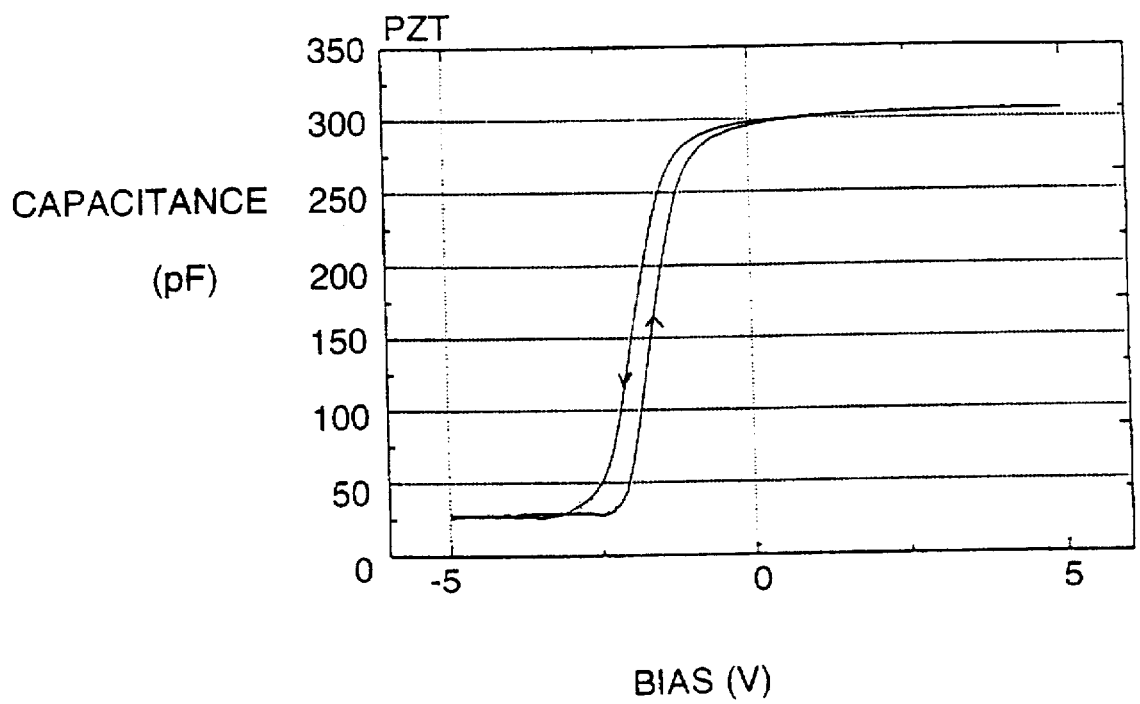
FIG. 14 is a graph showing a C-V curve of an MOS structure consisting of a $PZT(001)/BaTiO_3(001)/ZrO_2(001)$/Si(100) multilayer film.

FIG. 13 shows the results of X-ray analysis on this thin film. Only reflection by c plane was found, indicating that it was a unidirectionally oriented film. FIG. 14 shows a C-V curve. Hysteresis is found with the curve, indicating that a memory window of about 0.5 V was obtained. By taking advantage of this performance, a device (of MFIS structure) using the multilayer thin film as the gate oxide film of a transistor (FET) was fabricated to confirm memory operation.

Example 4

A multilayer thin film of Pt(001)/$BaTiO_3$(001)/$ZrO_2$(001) /Si(100) was obtained as in Example 2. A $BaTiO_3$ film was 100 nm thick and a Pt film was 100 nm thick. The Pt film was formed by evaporation with the substrate temperature set at 700° C.

Figure 15:
FIG. 15 is a section TEM photograph of a Pt film formed on a $BaTiO_3(001)/ZrO_2(001)$/Si(100) substrate.
Figure 16:
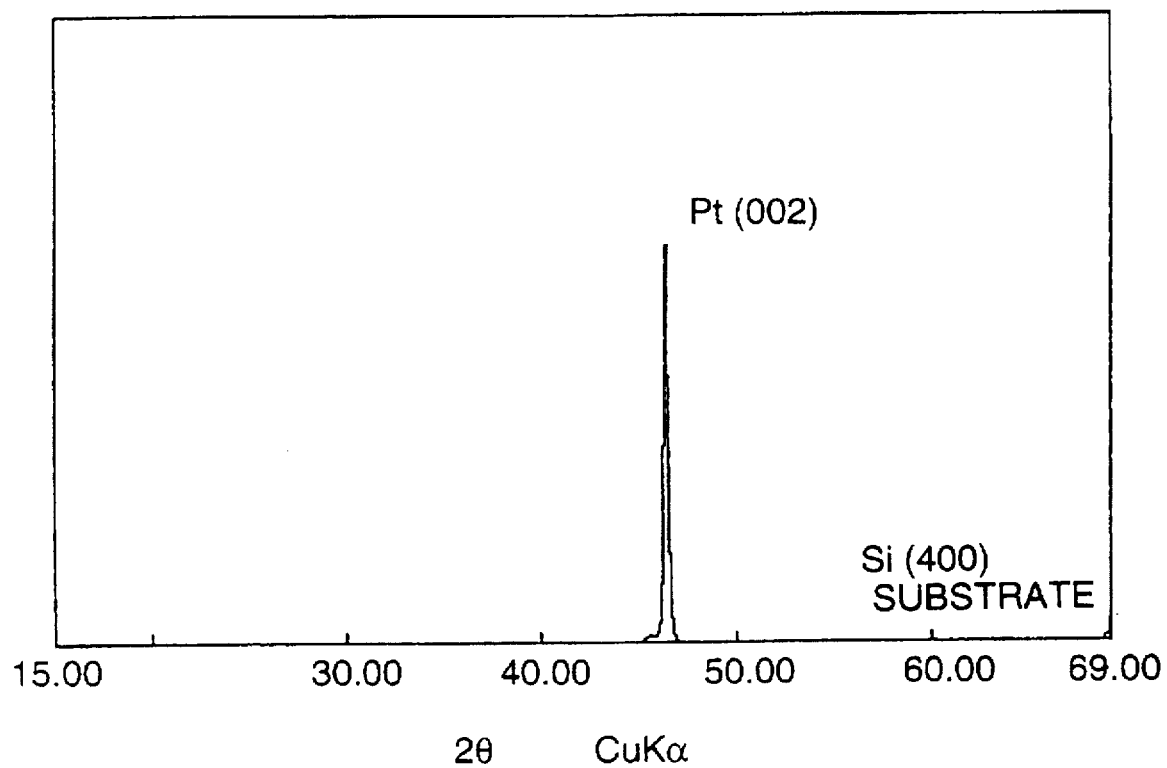
FIG. 16 is an X-ray diffraction diagram of the Pt film formed on a $BaTiO_3(001)/ZrO_2(001)$/Si(100) substrate.
Figure 17:
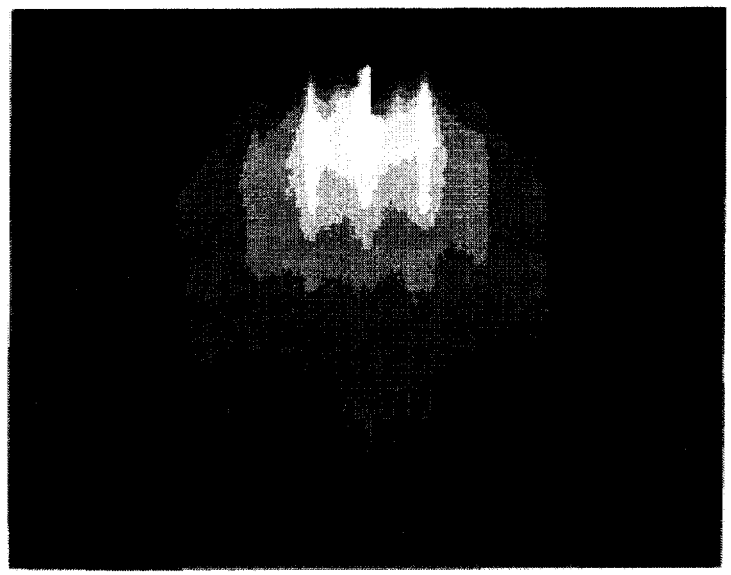
FIG. 17 is a drawing-substituting photograph showing the crystal structure of the Pt film formed on a $BaTiO_3(001)/ZrO_2(001)$/Si(100) substrate, illustrating a RHEED diffraction pattern resulting from an electron beam incident from a silicon single crystal [110] direction.

FIG. 15 is a section TEM photograph and FIG. 16 shows the results of X-ray analysis on the multilayer thin film. FIG. 17 is a RHEED pattern. It is evident from these results that an epitaxial Pt (001) film of quality was obtained. When Ir, Os, Pt, Re, Pd, Rh, Ru and alloys thereof were used instead of Pt, there were obtained epitaxial films of the same quality as the crystalline Pt film.

Example 5

Figure 18:
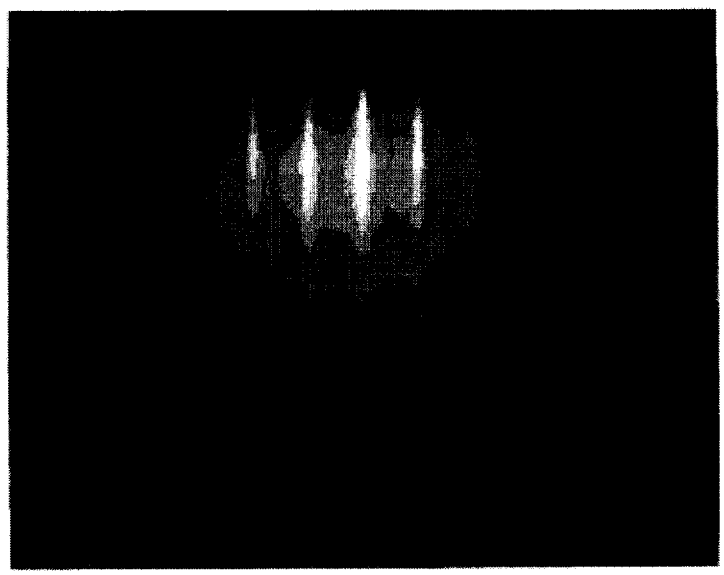
FIG. 18 is a drawing-substituting photograph showing the crystal structure of a $BaTiO_3$ film formed on a $Pt(001)/BaTiO_3(001)/ZrO_2(001)$/Si(100) substrate, illustrating a RHEED diffraction pattern resulting from an electron beam incident from a silicon single crystal [110] direction.
Figure 19:
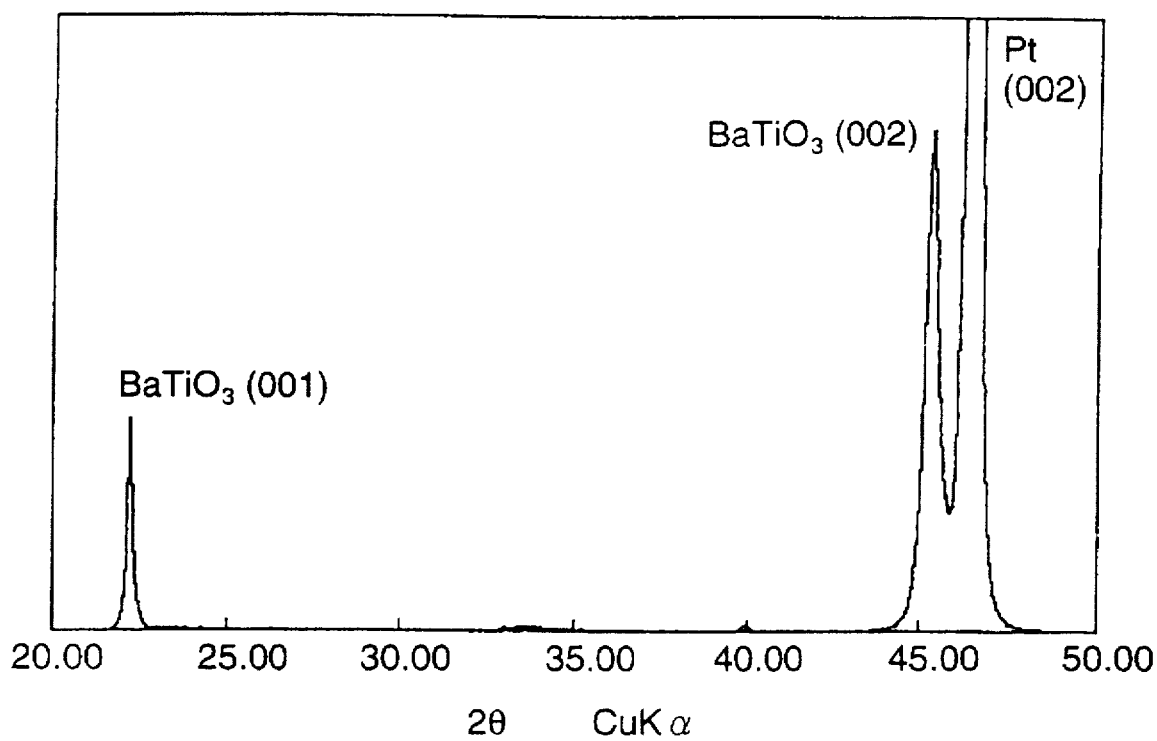
FIG. 19 is an X-ray diffraction diagram of the $BaTiO_3$ film formed on a $Pt(001)/BaTiO_3(001)/ZrO_2(001)$/Si(100) substrate.
Figure 20:
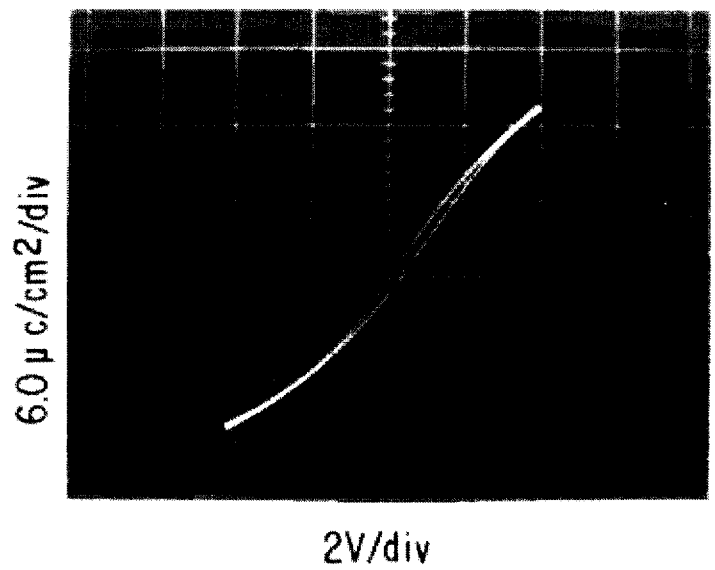
FIG. 20 shows a D-E hysteresis curve of the $BaTiO_3$ film formed on a $Pt(001)/BaTiO_3(001)/ZrO_2(001)$/Si(100) substrate.

A multilayer thin film of $BaTiO_3$(001)/Pt(001)/$BaTiO_3$ (001)/ $ZrO_2$(001)/Si(100) was obtained by forming $BaTiO_3$ of 300 nm thick on the Pt of the Example 4 structure. FIGS. 18, 19 and 20 show RHEED, XRD and D-E hysteresis curve of this thin film, respectively. The XRD proves that the BaTiO₃ film is a c-plane unidirectionally oriented film, and the RHEED proves that the axis-orientation relationship to the silicon substrate is BaTiO₃[100]//Si[100]. The D-E hysteresis was measured using a Sawyer-Tower circuit which was prepared by evaporating a Pt electrode on the BaTiO₃ film, with the Pt (001) film underlying the BaTiO₃ film made another electrode. A dielectric constant was measured at 100 kHz by means of an impedance analyzer using electrodes as used in the D-E hysteresis measurement, finding a value of 1,000. By taking advantage of this D-E hysteresis, a memory cell was fabricated on the silicon substrate along with FET to confirm memory operation.

Example 6

Figure 21:
FIG. 21 is a drawing-substituting photograph showing the crystal structure of a SBN film formed on a $Pt(001)/BaTiO_3(001)/ZrO_2(001)$/Si(100) substrate, illustrating a RHEED diffraction pattern resulting from an electron beam incident from a silicon single crystal [110] direction.
Figure 22:
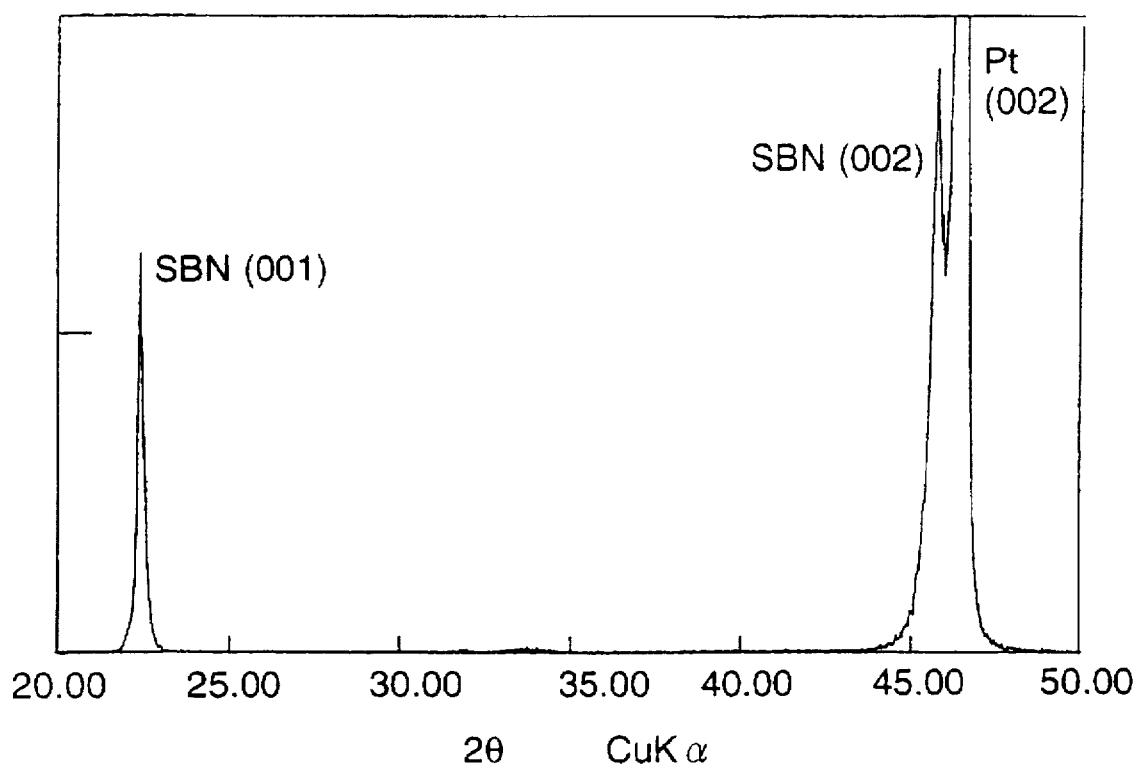
FIG. 22 is an X-ray diffraction diagram of the SBN film formed on a $Pt(001)/BaTiO_3(001)/ZrO_2(001)$/Si(100) substrate.
Figure 23:
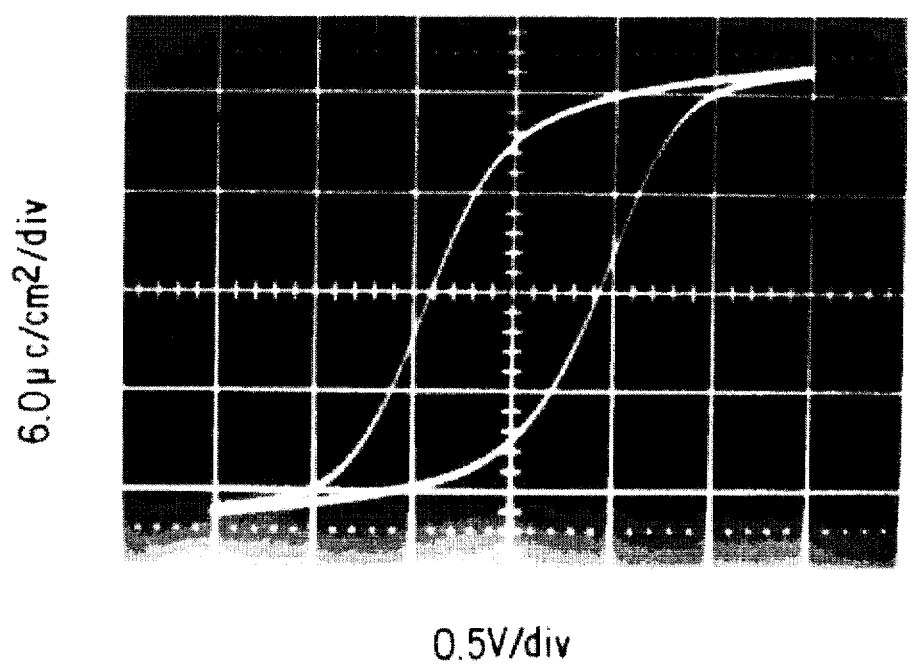
FIG. 23 shows a D-E hysteresis curve of the SBN film formed on a $Pt(001)/BaTiO_3(001)/ZrO_2(001)$/Si(100) substrate.
Figure 24:
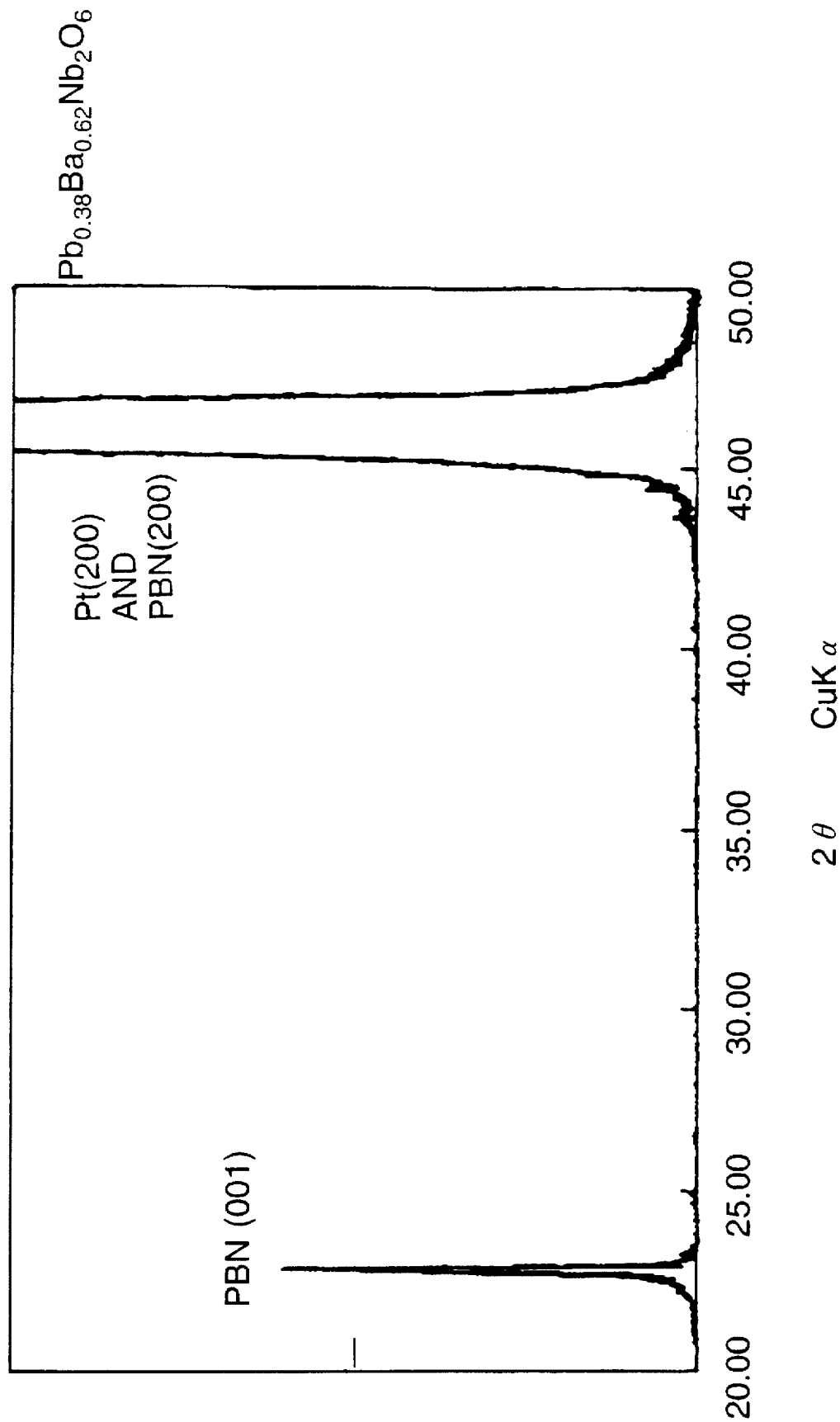
FIG. 24 is an X-ray diffraction diagram of a PBN film formed on a $Pt(001)/BaTiO_3(001)/ZrO_2(001)$/Si(100) substrate.

A multilayer thin film of SBN(001)/Pt(001)/BaTiO₃(001) /ZrO₂(001)/Si(100) and a multilayer thin film of PBN(001) /Pt(001)/BaTiO₃(001)/ZrO₂(001)/Si(100) were obtained by forming SBN or PBN (as in Example 2) of 300 nm thick on the Pt of the Example 4 structure. FIGS. 21, 22 and 23 show RHEED, XRD and D-E hysteresis curve of the SBN thin film, respectively. FIG. 24 shows XRD of the PBN thin film. The XRD proves that the SBN and PBN films are c-plane unidirectionally oriented films. The RHEED proves that the axis orientation relationship to the silicon substrate is SBN [100]//Si[100] and PBN[100]//Si[100]. The SBN and PBN films had a dielectric constant of 200 and 310, respectively. By taking advantage of the D-E hysteresis, memory cells were fabricated on the silicon substrate along with FET to confirm memory operation.

It is noted that the above-mentioned benefits were similarly obtained with perovskite or tungsten bronze films other than the above-mentioned ones or with conductive epitaxial layers and oxide thin films of materials other than the above-mentioned ones.

BENEFITS

The preparation method of the present invention enables epitaxial growth of a (001) BaTiO₃ thin film on a silicon substrate with an oxide thin film composed mainly of ZrO₂ interposed therebetween. The inventive method can form such a film under readily controllable conditions prohibiting accidental admission of impurities, in a reproducible manner, to high quality, and even on a large surface area throughout a substrate having a diameter of more than 2 inches, and is thus worth of industrial use. More particularly, the multilayer oxide thin film structure can be processed by a semiconductor process, without modifying its structure, and constructed as a capacitor and gate for DRAM by substituting for the conventional SiO₂. By forming silicon on the inventive substrate as a functional film, it can be applied as a SOI device. By taking advantage of ferroelectric and superconducting materials, there can be fabricated non-volatile memories, infrared sensors, optical modulators, optical switches, OEIC, SQUID, Josephson devices, superconducting transistors, electromagnetic sensors, and superconducting wire LSIs.

We claim:

1. A multilayer thin film comprising
    an oxide thin film formed on a semiconductor single crystal substrate, said oxide thin film comprising at least one epitaxial thin film composed mainly of zirconium oxide and
    an oriented thin film formed on said oxide thin film from a dielectric material of perovskite or tungsten bronze type with its c-plane unidirectionally oriented parallel to the substrate surface,
    wherein the zirconium oxide of said oxide thin film contains at least 93 mol % of Zr based on the amount of only constituent elements excluding oxygen.

2. The multilayer thin film of claim 1 wherein said dielectric material of perovskite or tungsten bronze type is selected from the group consisting of barium titanate, strontium titanate, lead zirconate titanate (PZT), strontium barium niobate (SBN) and lead barium niobate (PBN).

3. The multilayer thin film of claim 1 wherein said oriented thin film is an epitaxial film.

4. The multilayer thin film of claim 3 wherein said semiconductor single crystal substrate is a silicon single crystal substrate having a Si (100) plane at its surface and the crystal axis orientation relationship between said oriented thin film and the silicon single crystal substrate is perovskite or tungsten bronze [100]//Si [100].

5. The multilayer thin film of claim 1 wherein a rocking curve of (002) reflection of said oxide thin film has a half-value width of up to 1.5°.

6. The multilayer thin film of claim 1 wherein said oxide thin film has a ten point mean roughness Rz of up to 2 nm across a reference length of 500 nm over at least 80% of its surface.

7. The multilayer thin film of claim 1 wherein said oxide thin film is an oxide thin film comprising a first epitaxial film composed mainly of zirconium oxide and a second epitaxial film formed thereon of a perovskite type material.

8. The multilayer thin film of claim 7 wherein the perovskite type material of said second epitaxial film is composed mainly of barium titanate or strontium titanate.

9. The multilayer thin film of claim 7 wherein the crystal axis orientation relationship between said silicon single crystal substrate and said second epitaxial film of perovskite type material is perovskite [100]//Si [100].

10. A substrate for an electronic device comprising the multilayer thin film of claim 1.

11. An electronic device comprising the multilayer thin film of claim 1.

12. A method for preparing a multilayer thin film of claim 1 comprising a semiconductor single crystal substrate, an oxide thin film formed thereon from zirconium oxide or zirconium oxide stabilized with a rare earth metal element (inclusive of scandium and yttrium), and an oriented thin film formed on said oxide thin film from a perovskite or tungsten bronze type material, said method comprising
    carrying out in a vacuum chamber the steps of heating a silicon single crystal substrate, introducing an oxidizing gas into the vacuum chamber, and supplying zirconium or zirconium and at least one rare earth element (inclusive of scandium and yttrium) to the single crystal substrate surface by evaporation, thereby epitaxially growing the oxide thin film on the single crystal substrate surface to form a unidirectionally oriented epitaxial film which serves as said oxide thin film.

13. The method for preparing a multilayer thin film of claim 12 wherein the zirconium oxide or zirconium oxide stabilized with a rare earth metal element (inclusive of scandium and yttrium) has the composition: $Zr_{1-x}R_xO_{2-\delta}$ wherein R is a rare earth metal element inclusive of scandium and yttrium, x is a number of 0 to 0.75, and δ is a number of 0 to 0.5.

14. The method for preparing a multilayer thin film of claim 12 wherein said semiconductor single crystal substrate is a surface treated silicon substrate which is formed of a silicon single crystal substrate and has on its surface a 1×1 surface structure formed of zirconium or zirconium and at least one rare earth metal element (inclusive of scandium and yttrium) and oxygen.

15. The method for preparing a multilayer thin film of claim 12 wherein said surface treated silicon substrate used is a silicon single crystal substrate which has been treated by forming a silicon oxide layer of 0.2 to 10 nm thick on a substrate surface, setting the substrate at a temperature of 600° to 1,200° C., introducing an oxidizing gas into the vacuum chamber to establish an atmosphere of $1\times10^{-4}$ to $1\times10^{-1}$ Torr at least in the proximity of the substrate, and in these conditions, introducing by evaporation zirconium or zirconium and at least one rare earth metal element (inclusive of scandium and yttrium) to the substrate surface having the silicon oxide layer formed thereon.

16. The method for preparing a multilayer thin film of claim 15 wherein the step of forming a silicon oxide layer includes heating a silicon single crystal substrate at 300° to 700° C. in the vacuum chamber having an oxidizing gas introduced therein while establishing an oxygen partial pressure of not lower than $1\times10^{-4}$ Torr at least in the atmosphere proximate to the substrate in the vacuum chamber, thereby forming the silicon oxide layer.

17. The method for preparing a multilayer thin film of claim 12 wherein an oxidizing gas is injected toward the surface of said silicon single crystal substrate from the proximity thereof, thereby creating only in the vicinity of said single crystal substrate an atmosphere having a higher oxidizing gas partial pressure than the remainder.

18. The method for preparing a multilayer thin film of claim 12 wherein said silicon single crystal substrate has a surface area of at least 10 square centimeter and is rotated within its plane, thereby providing an atmosphere of high partial pressure oxidizing gas entirely over said single crystal substrate for forming a substantially uniform oxide thin film over the entire surface of said single crystal substrate.

19. The method for preparing a multilayer thin film of claim 12 wherein said silicon single crystal substrate is heated to at least 750° C. during formation of said epitaxial film.

20. The multilayer thin film of claim 1, wherein the zirconium oxide of said oxide thin film contains at least 95 mol % of Zr based on the amount of only constituent elements excluding oxygen.

21. The multilayer thin film of claim 1, wherein the zirconium oxide of said oxide thin film contains at least 98 mol % of Zr based on the amount of only constituent elements excluding oxygen.

22. A multilayer thin film comprising on a silicon single crystal substrate having a Si (100) plane at its surface
 a conductive oriented thin film which is an epitaxial film formed of a metal or a conductive oxide with its c-plane or a-plane unidirectionally oriented parallel to the substrate surface and
 an oxide thin film interposed between said silicon single crystal substrate and said epitaxial conductive thin film, said oxide thin film comprising at least one thin film composed mainly of zirconium oxide or zirconium oxide,
 wherein the zirconium oxide of said oxide thin film contains at least 93 mol % of Zr based on the amount of only constituent elements excluding oxygen.

23. The multilayer thin film of claim 22 wherein said metal is a metal containing at least one member selected from the group consisting of Pt, Ir, Os, Re, Pd, Rh, and Ru, and said conductive oxide is an indium-containing oxide or perovskite oxide.

24. The multilayer thin film of claim 22 wherein a rocking curve of (002) reflection of said oxide thin film has a half-value width of up to 1.5°.

25. The multilayer thin film of claim 22 wherein said oxide thin film has a ten point mean-roughness Rz of up to 2 nm across a reference length of 500 nm over at least 80% of its surface.

26. The multilayer thin film of claim 22 wherein said oxide thin film is an oxide thin film comprising at least a first epitaxial film composed mainly of zirconium oxide and a second epitaxial film formed thereon of a perovskite type material.

27. The multilayer thin film of claim 26 wherein the perovskite type material of said second epitaxial film is composed mainly of barium titanate or type strontium titanate.

28. The multilayer thin film of claim 26 wherein the crystal axis orientation relationship between said silicon single crystal substrate and said second epitaxial film of perovskite type material is perovskite [100]//Si [100].

29. A substrate for an electronic device comprising the multilayer thin film of claim 22.

30. An electronic device comprising the multilayer thin film of claim 22.

31. The multilayer thin film of claim 22, wherein the zirconium oxide of said oxide thin film contains at least 95 mol % of Zr based on the amount of only constituent elements excluding oxygen.

32. The multilayer thin film of claim 31, wherein the zirconium oxide of said oxide thin film contains at least 98 mol % of Zr based on the amount of only constituent elements excluding oxygen.

33. The multilayer thin film of claim 31 wherein said oxide thin film has a ten point mean roughness Rz of up to 2 nm across a reference length of 500 nm over at least 80% of its surface.

34. A multilayer thin film comprising on a silicon single crystal substrate of silicon single crystal having a Si (100) plane at its surface
 a conductive oriented film which is an epitaxial film formed of a metal or a conductive oxide with its c-plane or a-plane unidirectionally oriented parallel to the substrate surface,
 an oriented thin film formed on said conductive oriented film from a perovskite or tungsten bronze type material, and
 an oxide thin film interposed between said silicon single crystal substrate and said conductive oriented thin film, said oxide thin film comprising at least one thin film composed mainly of zirconium oxide,
 wherein the zirconium oxide of said oxide thin film contains at least 93 mol % of Zr based on the amount of only constituted elements excluding oxygen.

35. The multilayer thin film of claim 34 wherein said metal is a metal containing at least one member selected from the group consisting of Pt, Ir, Os, Re, Pd, Rh, and Ru, and said conductive oxide is an indium-containing oxide or perovskite oxide.

36. The multilayer thin film of claim 34 wherein said perovskite or tungsten bronze type material is selected from the group consisting of barium titanate, strontium titanate, lead zirconate titanate (PZT), strontium barium niobate (SBN) and lead barium niobate (PBN).

37. The multilayer thin film of claim 34 wherein said oriented thin film is an epitaxial film.

38. The multilayer thin film of claim 34 wherein the crystal axis orientation relationship between said silicon substrate and said oriented thin film is perovskite or tungsten bronze [100]//Si [100].

39. The multilayer thin film of claim 34 wherein the plane orientation relationship among said silicon single crystal substrate, said metal oriented thin film, and said oriented thin film is perovskite or tungsten bronze (100)//metal (100)//Si (100).

40. The multilayer thin film of claim 34 wherein a rocking curve of (002) reflection of said oxide thin film has a half-value width of up to 1.5°.

41. The multilayer thin film of claim 34 wherein said oxide thin film has a ten point mean roughness Rz of up to 2 nm across a reference length of 500 nm over at least 80% of its surface.

42. The multilayer thin film of claim 34 wherein said oxide thin film is an oxide thin film comprising at least a first epitaxial film composed mainly of zirconium oxide or zirconium oxide stabilized with a rare earth metal element (inclusive of scandium and yttrium) and a second epitaxial film formed thereon of a perovskite type material.

43. The multilayer thin film of claim 42 wherein the perovskite type material of said second epitaxial film is composed mainly of barium titanate or strontium titante.

44. The multilayer thin film of claim 42 wherein the crystal axis orientation relationship between said silicon single crystal substrate and said second epitaxial film of perovskite type material is perovskite [100]//Si [100].

45. A substrate for an electronic device comprising the multilayer thin film of claim 34.

46. An electronic device comprising the multilayer thin film of claim 34.

47. The laminate thin film of claim 34, wherein the zirconium oxide of said oxide thin film contains at least 95 mol % of Zr based on the amount of only constituent elements excluding oxygen.

48. The laminate thin film of claim 47, wherein the zirconium oxide of said oxide thin film contains at least 98 mol % of Zr based on the amount of only constituent elements excluding oxygen.

49. A multilayer thin film comprising
an oxide thin film formed on a semiconductor single crystal substrate, said oxide thin film comprising at least one epitaxial thin film composed mainly of zirconium oxide or zirconium oxide stabilized with a rare earth metal element (inclusive of scandium and yttrium), and
an oriented thin film formed on said oxide thin film from a dielectric material of perovskite or tungsten bronze type with its c-plane unidirectionally oriented parallel to the substrate surface,
wherein a rocking curve of (002) reflection of said oxide thin film has a half-value width of up to 1.5°.

50. A substrate for an electronic device comprising the multilayer thin film of claim 49.

51. An electronic device comprising the multilayer thin film of claim 49.

52. A method for preparing a multilayer thin film comprising a semiconductor single crystal substrate, an oxide thin film formed thereon from zirconium oxide or zirconium oxide stabilized with a rare earth metal element (inclusive of scandium and yttrium), and an oriented thin film formed on said oxide thin film from a perovskite or tungsten bronze type material of claim 49, said method comprising
carrying out in a vacuum chamber the steps of heating a silicon single crystal substrate, introducing an oxidizing gas into the vacuum chamber, and supplying zirconium or zirconium and at least one rare earth element (inclusive of scandium and yttrium) to the single crystal substrate surface by evaporation, thereby epitaxially growing the oxide thin film on the single crystal substrate surface to form a unidirectionally oriented epitaxial film which serves as said oxide thin film.

53. The method for preparing a multilayer thin film of claim 52 wherein the zirconium oxide or zirconium oxide stabilized with a rare earth metal element (inclusive of scandium and yttrium) has the composition: $Zr_{1-x}R_xO_{2-\delta}$ wherein R is a rare earth metal element inclusive of scandium and yttrium, x is a number of 0 to 0.75, and $\delta$ is a number of 0 to 0.5.

54. The method for preparing a multilayer thin film of claim 52 wherein said semiconductor single crystal substrate is a surface treated silicon substrate which is formed of a silicon single crystal substrate and has on its surface a 1×1 surface structure formed of zirconium or zirconium and at least one rare earth metal element (inclusive of scandium and yttrium) and oxygen.

55. The method for preparing a multilayer thin film of claim 52 wherein said surface treated silicon substrate used is a silicon single crystal substrate which has been treated by forming a silicon oxide layer of 0.2 to 10 nm thick on a substrate surface, setting the substrate at a temperature of 600° to 1,200° C., introducing an oxidizing gas into the vacuum chamber to establish an atmosphere of $1\times10^{-4}$ to $1\times10^{-1}$ Torr at least in the proximity of the substrate, and in these conditions, introducing by evaporation zirconium or zirconium and at least one rare earth metal element (inclusive of scandium and yttrium) to the substrate surface having the silicon oxide layer formed thereon.

56. The method for preparing a multilayer thin film of claim 55 wherein the step of forming a silicon oxide layer includes heating a silicon single crystal substrate at 300° to 700° C. in the vacuum chamber having an oxidizing gas introduced therein while establishing an oxygen partial pressure of not lower than $1\times10^{-4}$ Torr at least in the atmosphere proximate to the substrate in the vacuum chamber, thereby forming the silicon oxide layer.

57. The method for preparing a multilayer thin film of claim 52 wherein an oxidizing gas is injected toward the surface of said silicon single crystal substrate from the proximity thereof, thereby creating only in the vicinity of said single crystal substrate an atmosphere having a higher oxidizing gas partial pressure than the remainder.

58. The method for preparing a multilayer thin film of claim 52 wherein said silicon single crystal substrate has a surface area of at least 10 square centimeter and is rotated within its plane, thereby providing an atmosphere of high partial pressure oxidizing gas entirely over said single crystal substrate for forming a substantially uniform oxide thin film over the entire surface of said single crystal substrate.

59. The method for preparing a multilayer thin film of claim 52 wherein said silicon single crystal substrate is heated to at least 750° C. during formation of said epitaxial film.

60. The multilayer thin film of claim 49 wherein said dielectric material of perovskite or tungsten bronze type is selected from the group consisting of barium titanate, strontium titanate, lead zirconate titanate (PZT), strontium barium niobate (SEN) and lead barium niobate (PBN).

61. The multilayer thin film of claim 49 wherein said oriented thin film is an epitaxial film.

62. The multilayer thin film of claim 61 wherein said semiconductor single crystal substrate is a silicon single crystal substrate having a Si (100) plane at its surface and the crystal axis orientation relationship between said oriented thin film and the silicon single crystal substrate is perovskite or tungsten bronze [100]//Si [100].

63. The multilayer thin film of claim 49 wherein the zirconium oxide or zirconium oxide stabilized with a rare earth metal element (inclusive of scandium and yttrium) of said oxide thin film has the composition: $Zr_{1-x}R_xO_{2-\delta}$ wherein R is a rare earth metal element inclusive of scandium and yttrium, x is a number of 0 to 0.75, and $\delta$ is a number of 0 to 0.5.

64. The multilayer thin film of claim 49 wherein said oxide thin film has a ten point mean roughness Rz of up to 2 nm across a reference length of 500 nm over at least 80% of its surface.

65. The multilayer thin film of claim 49 wherein said oxide thin film is an oxide thin film comprising a first epitaxial film composed mainly of zirconium oxide or zirconium oxide stabilized with a rare earth metal element (inclusive of scandium and yttrium) and a second epitaxial film formed thereon of a perovskite type material.

66. The multilayer thin film of claim 65 wherein the perovskite type material of said second epitaxial film is composed mainly of barium titanate or strontium titanate.

67. The multilayer thin film of claim 65 wherein the crystal axis orientation relationship between said silicon single crystal substrate and said second epitaxial film of perovskite type material is perovskite [100]//Si [100].

68. A method for preparing a multilayer thin film comprising a semiconductor single crystal substrate, an oxide thin film formed thereon from zirconium oxide or zirconium oxide stabilized with a rare earth metal element (inclusive of scandium and yttrium), and an oriented thin film formed on said oxide thin film from a perovskite or tungsten bronze type material of claim 49, said method comprising carrying out in a vacuum chamber the steps of heating a silicon single crystal substrate having the oxide thin film formed thereon, introducing an oxidizing gas into the vacuum chamber, and supplying by evaporation constituent metals of the perovskite or tungsten bronze type material to the silicon single crystal substrate surface having the oxide oriented film formed thereon, wherein in an initial stage when a film is being formed to a thickness of 0 to 1 nm, an A site metal and a B site metal of the perovskite or tungsten bronze composition are supplied such that the feed ratio A/B in molar ratio may range from 0 to 1 for the perovskite type material and from 0 to 0.5 for the tungsten bronze type material, thereby epitaxially growing the oriented film on the oxide thin film to form a c-plane unidirectionally oriented film which serves as said oriented film.

69. The method for preparing a multilayer thin film of claim 68 wherein said silicon single crystal substrate is heated to at least 800° C. during formation of said epitaxial film.

70. A multilayer thin film comprising an oxide thin film formed on a semiconductor single crystal substrate, said oxide thin film comprising at least one epitaxial thin film composed mainly of zirconium oxide or zirconium oxide stabilized with a rare earth metal element (inclusive of scandium and yttrium), and an oriented thin film formed on said oxide thin film from a dielectric material of perovskite or tungsten bronze type with its c-plane unidirectionally oriented parallel to the substrate surface, wherein said oxide thin film has a ten point mean roughness Rz of up to 2 nm across a reference length of 500 nm over at least 80% of its surface.

71. A substrate for an electronic device comprising the multilayer thin film of claim 70.

72. An electronic device comprising the multilayer thin film of claim 70.

73. A method for preparing a multilayer thin film comprising a semiconductor single crystal substrate, an oxide thin film formed thereon from zirconium oxide or zirconium oxide stabilized with a rare earth metal element (inclusive of scandium and yttrium), and an oriented thin film formed on said oxide thin film from a perovskite or tungsten bronze type material of claim 70, said method comprising carrying out in a vacuum chamber the steps of heating a silicon single crystal substrate, introducing an oxidizing gas into the vacuum chamber, and supplying zirconium or zirconium and at least one rare earth element (inclusive of scandium and yttrium) to the single crystal substrate surface by evaporation, thereby epitaxially growing the oxide thin film on the single crystal substrate surface to form a unidirectionally oriented epitaxial film which serves as said oxide thin film.

74. The method for preparing a multilayer thin film of claim 73 wherein the zirconium oxide or zirconium oxide stabilized with a rare earth metal element (inclusive of scandium and yttrium) has the composition: $Zr_{1-x}R_xO_{2-\delta}$ wherein R is a rare earth metal element inclusive of scandium and yttrium, x is a number of 0 to 0.75, and $\delta$ is a number of 0 to 0.5.

75. The method for preparing a multilayer thin film of claim 73 wherein said semiconductor single crystal substrate is a surface treated silicon substrate which is formed of a silicon single crystal substrate and has on its surface a 1×1 surface structure formed of zirconium or zirconium and at least one rare earth metal element (inclusive of scandium and yttrium) and oxygen.

76. The method for preparing a multilayer thin film of claim 73 wherein said surface treated silicon substrate used is a silicon single crystal substrate which has been treated by forming a silicon oxide layer of 0.2 to 10 nm thick on a substrate surface, setting the substrate at a temperature of 600° to 1,200° C., introducing an oxidizing gas into the vacuum chamber to establish an atmosphere of $1\times10^{-4}$ to $1\times10^{-1}$ Torr at least in the proximity of the substrate, and in these conditions, introducing by evaporation zirconium or zirconium and at least one rare earth metal element (inclusive of scandium and yttrium) to the substrate surface having the silicon oxide layer formed thereon.

77. The method for preparing a multilayer thin film of claim 76 wherein the step of forming a silicon oxide layer includes heating a silicon single crystal substrate at 300° to 700° C. in the vacuum chamber having an oxidizing gas introduced therein while establishing an oxygen partial pressure of not lower than $1\times10^{-4}$ Torr at least in the atmosphere proximate to the substrate in the vacuum chamber, thereby forming the silicon oxide layer.

78. The method for preparing a multilayer thin film of claim 73 wherein an oxidizing gas is injected toward the surface of said silicon single crystal substrate from the proximity thereof, thereby creating only in the vicinity of said single crystal substrate an atmosphere having a higher oxidizing gas partial pressure than the remainder.

79. The method for preparing a multilayer thin film of claim 73 wherein said silicon single crystal substrate has a surface area of at least 10 square centimeter and is rotated within its plane, thereby providing an atmosphere of high partial pressure oxidizing gas entirely over said single crystal substrate for forming a substantially uniform oxide thin film over the entire surface of said single crystal substrate.

80. The method for preparing a multilayer thin film of claim 73 wherein said silicon single crystal substrate is heated to at least 750° C. during formation of said epitaxial film.

81. The multilayer thin film of claim 70 wherein said dielectric material of perovskite or tungsten bronze type is selected from the group consisting of barium titanate, strontium titanate, lead zirconate titanate (PZT), strontium barium niobate (SBN) and lead barium niobate (PEN).

82. The multilayer thin film of claim 70 wherein said oriented thin film is an epitaxial film.

83. The multilayer thin film of claim 82 wherein said semiconductor single crystal substrate is a silicon single crystal substrate having a Si (100) plane at its surface and the crystal axis orientation relationship between said oriented thin film and the silicon single crystal substrate is perovskite or tungsten bronze [100]//Si[100].

84. The multilayer thin film of claim 70 wherein the zirconium oxide or zirconium oxide stabilized with a rare earth metal element (inclusive of scandium and yttrium) of said oxide thin film has the composition: $Zr_{1-x}R_xO_{2-\delta}$ wherein R is a rare earth metal element inclusive of scandium and yttrium, x is a number of 0 to 0.75, and $\delta$ is a number of 0 to 0.5.

85. The multilayer thin film of claim 70 wherein said oxide thin film is an oxide thin film comprising a first epitaxial film composed mainly of zirconium oxide or zirconium oxide stabilized with a rare earth metal element (inclusive of scandium and yttrium) and a second epitaxial film formed thereon of a perovskite type material.

86. The multilayer thin film of claim 85 wherein the perovskite type material of said second epitaxial film is composed mainly of barium titanate or strontium titanate.

87. The multilayer thin film of claim 85 wherein the crystal axis orientation relationship between said silicon single crystal substrate and said second epitaxial film of perovskite type material is perovskite [100]//Si [100].

88. A method for preparing a multilayer thin film comprising a semiconductor single crystal substrate, an oxide thin film formed thereon from zirconium oxide or zirconium oxide stabilized with a rare earth metal element (inclusive of scandium and yttrium), and an oriented thin film formed on said oxide thin film from a perovskite or tungsten bronze type material of claim 70, said method comprising carrying out in a vacuum chamber the steps of heating a silicon single crystal substrate having the oxide thin film formed thereon, introducing an oxidizing gas into the vacuum chamber, and supplying by evaporation constituent metals of the perovskite or tungsten bronze type material to the silicon single crystal substrate surface having the oxide oriented film formed thereon, wherein in an initial stage when a film is being formed to a thickness of 0 to 1 nm, an A site metal and a B site metal of the perovskite or tungsten bronze composition are supplied such that the feed ratio A/B in molar ratio may range from 0 to 1 for the perovskite type material and from 0 to 0.5 for the tungsten bronze type material, thereby epitaxially growing the oriented film on the oxide thin film to form a c-plane unidirectionally oriented film which serves as said oriented film.

89. The method for preparing a multilayer thin film of claim 88 wherein said silicon single crystal substrate is heated to at least 800° C. during formation of said epitaxial film.

90. A multilayer thin film comprising on a silicon single crystal substrate having a Si (100) plane at its surface a conductive oriented thin film which is an epitaxial film formed of a metal or a conductive oxide with its c-plane or a-plane and unidirectionally oriented parallel to the substrate surface and an oxide thin film interposed between said silicon single crystal substrate and said conductive oriented thin film, said oxide thin film comprising at least one thin film composed mainly of zirconium oxide or zirconium oxide stabilized with a rare earth element (inclusive of scandium and yttrium), wherein a rocking curve of (002) reflection of said oxide thin film has a half-value width of up to 1.5°.

91. A substrate for an electronic device comprising the multilayer thin film of claim 90.

92. An electronic device comprising the multilayer thin film of claim 90.

93. The multilayer thin film of claim 90 wherein said metal is a metal containing at least one member selected from the group consisting of Pt, Ir, Os, Re, Pd, Rh, and Ru, and said conductive oxide is an indium-containing oxide or perovskite oxide.

94. The multilayer thin film of claim 90 wherein the zirconium oxide or zirconium oxide stabilized with a rare earth metal element (inclusive of scandium and yttrium) of said oxide thin film has the composition: $Zr_{1-x}R_xO_{2-\delta}$ wherein R is a rare earth metal element inclusive of scandium and yttrium, x is a number of 0 to 0.75, and $\delta$ is a number of 0 to 0.5.

95. The multilayer thin film of claim 90 wherein said oxide thin film is an oxide thin film comprising at least a first epitaxial film composed mainly of zirconium oxide or zirconium oxide stabilized with a rare earth metal element (inclusive of scandium and yttrium) and a second epitaxial film formed thereon of a perovskite type material.

96. The multilayer thin film of claim 95 wherein the perovskite type material of said second epitaxial film is composed mainly of barium titanate or strontium titanate.

97. The multilayer thin film of claim 95 wherein the crystal axis orientation relationship between said silicon single crystal substrate and said second epitaxial film of perovskite type material is perovskite [100]//Si [100].

98. A multilayer thin film comprising on a silicon single crystal substrate having a Si (100) plane at its surface a conductive oriented thin film which is an epitaxial film formed of a metal or a conductive oxide with its c-plane or a-plane unidirectionally oriented parallel to the substrate surface and an oxide thin film interposed between said silicon single crystal substrate and said conductive oriented thin film, said oxide thin film comprising at least one thin film composed mainly of zirconium oxide or zirconium oxide stabilized with a rare earth element (inclusive of scandium and yttrium), wherein said oxide thin film has a ten point mean roughness Rz of up to 2 nm across a reference length of 500 nm over at least 80% of its surface.

99. A substrate for an electronic device comprising the multilayer thin film of claim 98.

100. An electronic device comprising the multilayer thin film of claim 98.

101. The multilayer thin film of claim 98 wherein said metal is a metal containing at least one member selected from the group consisting of Pt, Ir, Os, Re, Pd, Rh, and Ru, and said conductive oxide is an indium-containing oxide or perovskite oxide.

102. The multilayer thin film of claim 98 wherein the zirconium oxide or zirconium oxide stabilized with a rare earth metal element (inclusive of scandium and yttrium) of said oxide thin film has the composition: $Zr_{1-x}R_xO_{2-\delta}$ wherein R is a rare earth metal element inclusive of scandium and yttrium, x is a number of 0 to 0.75, and $\delta$ is a number of 0 to 0.5.

103. The multilayer thin film of claim 98 wherein said oxide thin film is an oxide thin film comprising at least a first epitaxial film composed mainly of zirconium oxide or zirconium oxide stabilized with a rare earth metal element (inclusive of scandium and yttrium) and a second epitaxial film formed thereon of a perovskite type material.

104. The multilayer thin film of claim 103 wherein the perovskite type material of said second epitaxial film is composed mainly of barium titanate or strontium titanate.

105. The multilayer thin film of claim 103 wherein the crystal axis orientation relationship between said silicon single crystal substrate and said second epitaxial film of perovskite type material is perovskite [100]//Si [100].

106. A multilayer thin film comprising on a silicon single crystal substrate of silicon single crystal having a Si (100) plane at its surface
- a conductive oriented film which is an epitaxial film formed of a metal or a conductive oxide with its c-plane or a-plane unidirectionally oriented parallel to the substrate surface,
- an oriented thin film formed on said conductive oriented film from a perovskite or tungsten bronze type material, and
- an oxide thin film interposed between said silicon single crystal substrate and said epitaxial conductive thin film, said oxide thin film comprising at least one thin film composed mainly of zirconium oxide or zirconium oxide stabilized with a rare earth element (inclusive of scandium and yttrium),
- wherein a rocking curve of (002) reflection of said oxide thin film has a half-value width of up to 1.5°.

107. A substrate for an electronic device comprising the multilayer thin film of claim 106.

108. An electronic device comprising the multilayer thin film of claim 106.

109. The multilayer thin film of claim 106 wherein said metal is a metal containing at least one member selected from the group consisting of Pt, Ir, Os, Re, Pd, Rh, and Ru, and said conductive oxide is an indium-containing oxide or perovskite oxide.

110. The multilayer thin film of claim 106 wherein said perovskite or tungsten bronze type material is selected from the group consisting of barium titanate, strontium titanate, lead zirconate titanate (PZT), strontium barium niobate (SBN) and lead barium niobate (PBN).

111. The multilayer thin film of claim 106 wherein said oriented thin film is an epitaxial film.

112. The multilayer thin film of claim 106 wherein the plane orientation relationship among said silicon single crystal substrate, said metal oriented thin film, and said oriented thin film is perovskite or tungsten bronze (100)/ metal (100)//Si (100).

113. The multilayer thin film of claim 106 wherein the zirconium oxide or zirconium oxide stabilized with a rare earth metal element (inclusive of scandium and yttrium) of said oxide thin film has the composition: $Zr_{1-x}R_xO_{2-\delta}$ wherein R is a rare earth metal element inclusive of scandium and yttrium, x is a number of 0 to 0.75, and $\delta$ is a number of 0 to 0.5.

114. The multilayer thin film of claim 106 wherein said oxide thin film has a ten point mean roughness Rz of up to 2 nm across a reference length of 500 nm over at least 80% of its surface.

115. The multilayer thin film of claim 106 wherein said oxide thin film is an oxide thin film comprising at least a first epitaxial film composed mainly of zirconium oxide or zirconium oxide stabilized with a rare earth metal element (inclusive of scandium and yttrium) and a second epitaxial film formed thereon of a perovskite type material.

116. The multilayer thin film of claim 115 wherein the perovskite type material of said second epitaxial film is composed mainly of barium titanate or strontium titanate.

117. A multilayer thin film comprising on a silicon single crystal substrate of silicon single crystal having a Si (100) plane at its surface
- a conductive oriented thin film which is an epitaxial film formed of a metal or a conductive oxide with its c-plane or a-plane unidirectionally oriented parallel to the substrate surface,
- an oriented thin film formed on said conductive oriented film from a perovskite or tungsten bronze type material, and
- an oxide thin film interposed between said silicon single crystal substrate and said epitaxial conductive thin film, said oxide thin film comprising at least one thin film composed mainly of zirconium oxide or zirconium oxide stabilized with a rare earth element (inclusive of scandium and yttrium),
- wherein said oxide thin film has a ten point mean roughness Rz of up to 2 nm across a reference length of 500 nm over at least 80% of its surface.

118. A substrate for an electronic device comprising the multilayer thin film of claim 117.

119. An electronic device comprising the multilayer thin film of claim 117.

120. The multilayer thin film of claim 117 wherein said metal is a metal containing at least one member selected from the group consisting of Pt, Ir, Os, Re, Pd, Rh, and Ru, and said conductive oxide is an indium-containing oxide or perovskite oxide.

121. The multilayer thin film of claim 117 wherein said perovskite or tungsten bronze type material is selected from the group consisting of barium titanate, strontium titanate, lead zirconate titanate (PZT), strontium barium niobate (SBN) and lead barium niobate (PBN).

122. The multilayer thin film of claim 117 wherein said oriented thin film is an epitaxial film.

123. The multilayer thin film of claim 117 wherein the plane orientation relationship among said silicon single crystal substrate, said metal oriented thin film, and said oriented thin film is perovskite or tungsten bronze (100)// metal (100)//Si (100).

124. The multilayer thin film of claim 117 wherein the zirconium oxide or zirconium oxide stabilized with a rare earth metal element (inclusive of scandium and yttrium) of said oxide thin film has the composition: $Zr_{1-x}R_xO_{2-\delta}$ wherein R is a rare earth metal element inclusive of scandium and yttrium, x is a number of 0 to 0.75, and $\delta$ is a number of 0 to 0.5.

125. The multilayer thin film of claim 117 wherein said oxide thin film is an oxide thin film comprising at least a first epitaxial film composed mainly of zirconium oxide or zirconium oxide stabilized with a rare earth metal element (inclusive of scandium and yttrium) and a second epitaxial film formed thereon of a perovskite type material.

126. The multilayer thin film of claim 125 wherein the perovskite type material of said second epitaxial film is composed mainly of barium titanate or strontium titanate.

127. A multilayer thin film comprising
- an oriented thin film which is formed on a silicon single crystal substrate of silicon single crystal having a Si (100) plane at its surface from a perovskite or tungsten bronze type material and an oxide thin film interposed between said silicon single crustal substrate and said oriented thin film, said oxide thin film comprising at least one thin film composed mainly of zirconium oxide or zirconium oxide stabilized with a rare earth metal element (inclusive of scandium and yttrium), a crystal axis orientation relationship being perovskite or tungsten bronze [100]//oxide [100]//Si [100] and a plane orientation relationship being perovskite or tungsten bronze (100)//oxide (001)//Si (100).

128. The multilayer thin film of claim 127 wherein the zirconium oxide or zirconium oxide stabilized with a rare earth metal element (inclusive of scandium and yttrium) of said oxide thin film has the composition: $Zr_{1-x}R_xO_{2-\delta}$ wherein R is a rare earth metal element inclusive of scandium and yttrium, x is a number of 0 to 0.75, and $\delta$ is a number of 0 to 0.5.

129. The multilayer thin film of claim 127 wherein the zirconium oxide of said oxide thin film contains at least 93 mol % of Zr based on the amount of only constituent elements excluding oxygen.

130. The multilayer thin film of claim 127 wherein a rocking curve of (002) reflection of said oxide thin film has a half-value width of up to 1.5°.

131. The multilayer thin film of claim 127 wherein said oxide thin film has a ten point mean roughness Rz of up to 2 nm across a reference length of 500 nm over at least 80% of its surface.

132. The multilayer thin film of claim 127 wherein said oxide thin film is an oxide thin film comprising at least a first epitaxial film composed mainly of zirconium oxide or zirconium oxide stabilized with a rare earth metal element (inclusive of scandium and yttrium) and a second epitaxial film formed thereon of a perovskite type material.

133. The multilayer thin film of claim 132 wherein the perovskite type material of said second epitaxial film is composed mainly of barium titanate or type strontium titanate.

134. The multilayer thin film of claim 132 wherein the crystal axis orientation relationship between said silicon single crystal substrate and said second epitaxial film of perovskite type material is perovskite [100]//Si [100] and perovskite (001)//Si (001).

135. A method for preparing a multilayer thin film of claim 127 comprising a semiconductor single crystal substrate, an oxide thin film formed thereon from zirconium oxide or zirconium oxide stabilized with a rare earth metal element (inclusive of scandium and yttrium), and an oriented thin film formed on said oxide thin film from a perovskite or tungsten bronze type material, said method comprising carrying out in a vacuum chamber the steps of heating a silicon single crystal substrate having the oxide thin film formed thereon, introducing an oxidizing gas into the vacuum chamber, and supplying by evaporation constituent metals of the perovskite or tungsten bronze type material to the silicon single crystal substrate surface having the oxide oriented film formed thereon, wherein in an initial stage when a film is being formed to a thickness of 0 to 1 nm, an A site metal and a B site metal of the perovskite or tungsten bronze composition are supplied such that the feed ratio A/B in molar ratio may range from 0 to 1 for the perovskite type material and from 0 to 0.5 for the tungsten bronze type material, thereby epitaxially growing the oriented film on the oxide thin film to form a c-plane unidirectionally oriented film which serves as said oriented film.

136. The method for preparing a multilayer thin film of claim 135 wherein said silicon single crystal substrate is heated to at least 800° C. during formation of said epitaxial film.

137. A substrate for an electronic device comprising the multilayer thin film of claim 127.

138. An electronic device comprising the multilayer thin film of claim 127.

139. The multilayer thin film of claim 127, wherein the zirconium oxide of said oxide thin film contains at least 95 mol % of Zr based on the amount of only constituent elements excluding oxygen.

140. The multilayer thin film of claim 139, wherein the zirconium oxide of said oxide thin film contains at least 98 mol % of Zr based on the amount of only constituent elements excluding oxygen.

141. The multilayer thin film of claim 127 wherein said perovskite or tungsten bronze type material is selected from the group consisting of barium titanate, strontium titanate, lead zirconate titanate (PZT), strontium barium niobate (SBN) and lead barium niobate (PBN).

* * * * *

UNITED STATES PATENT AND TRADEMARK OFFICE
CERTIFICATE OF CORRECTION

PATENT NO. : 5,753,934
DATED : May 19, 1998
INVENTOR(S) : Yoshihiko YANO, et al.

It is certified that error appears in the above-identified patent and that said Letters Patent is hereby corrected as shown below:

On the title page item [73], Assignee's name is incorrect, it should read:

--TDK Corporation--

Signed and Sealed this

Twenty-fourth Day of November, 1998

Attest:

BRUCE LEHMAN

*Attesting Officer*  *Commissioner of Patents and Trademarks*

UNITED STATES PATENT AND TRADEMARK OFFICE
CERTIFICATE OF CORRECTION

PATENT NO. : 5,753,934
DATED : MAY 19, 1998
INVENTOR(S) : YOSHIHIKO YANO, ET AL.

It is certified that error appears in the above-identified patent and that said Letters Patent is hereby corrected as shown below:

Column 32, line 14 delete "type".

Column 34, line 62 "(SEN)" should read --(SBN)--.

Column 37, line 9 "(PEN)." should read --(PBN).--.

Column 39, line 55 "(100)/" should read --(100)//--.

Column 41, line 4 "crustal" should read --crystal--.

Column 41, line 39 delete "type".

Signed and Sealed this

Sixteenth Day of March, 1999

Attest:

Q. TODD DICKINSON

Attesting Officer     Acting Commissioner of Patents and Trademarks